US011189774B2

(12) United States Patent
Narayan

(10) Patent No.: US 11,189,774 B2
(45) Date of Patent: Nov. 30, 2021

(54) HIGH-TEMPERATURE CARBON-BASED SUPERCONDUCTOR: B-DOPED Q-CARBON

(71) Applicant: NORTH CAROLINA STATE UNIVERSITY, Raleigh, NC (US)

(72) Inventor: Jagdish Narayan, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 183 days.

(21) Appl. No.: 16/614,686

(22) PCT Filed: May 31, 2018

(86) PCT No.: PCT/US2018/035374
§ 371 (c)(1),
(2) Date: Nov. 18, 2019

(87) PCT Pub. No.: WO2018/222860
PCT Pub. Date: Dec. 6, 2018

(65) Prior Publication Data
US 2021/0296561 A1 Sep. 23, 2021

Related U.S. Application Data

(60) Provisional application No. 62/513,026, filed on May 31, 2017.

(51) Int. Cl.
*H01L 21/3205* (2006.01)
*H01L 39/24* (2006.01)
(Continued)

(52) U.S. Cl.
CPC ............ *H01L 39/249* (2013.01); *C23C 16/26* (2013.01); *C23C 16/56* (2013.01); *H01L 39/12* (2013.01)

(58) Field of Classification Search
CPC .................................................. H01L 21/32058
See application file for complete search history.

(56) References Cited

U.S. PATENT DOCUMENTS 6,066,270 A * 5/2000 Eckert ..................... C04B 35/56
                                                        252/521.1
6,080,470 A    6/2000 Dorfman
(Continued)

OTHER PUBLICATIONS

Matsudaira et al., "Pressure-Induced Superconductivity and Phonon Frequency in Paperlike Thin Films of Boron-Doped Carbon Nanotubes", Physical Review, vol. 82, Issue 4, Jul. 2, 2010, 6 pages.
(Continued)

*Primary Examiner* — Jae Lee
(74) *Attorney, Agent, or Firm* — Kilpatrick Townsend & Stockton LLP

(57) ABSTRACT

Certain embodiments involve processes or systems for creating various high-temperature superconductive structures or materials. For example, a method can involve depositing a first layer of boron and a second layer of un-doped amorphous carbon on a substrate. The un-doped amorphous carbon is ferromagnetic. The first layer of boron and the second layer of un-doped amorphous carbon are melted by a laser pulse to form a melted boron-doped amorphous carbon. The melted boron-doped amorphous carbon is quenched to create a quenched boron-doped amorphous carbon that is diamagnetic and superconducting. The quenched melted boron-doped amorphous carbon includes a mixture of sp3 bonded carbon atoms and sp2 bonded carbon atoms and a superconducting transition temperature of the quenched boron-doped amorphous carbon is much higher than diamond and increases based on a boron concentration. Undoped Q-carbon is ferromagnetic with Curie temperature above 500K.

20 Claims, 26 Drawing Sheets

(51) Int. Cl.
      *C23C 16/56*      (2006.01)
      *C23C 16/26*      (2006.01)
      *H01L 39/12*      (2006.01)

(56) References Cited

U.S. PATENT DOCUMENTS 7,122,837 B2   10/2006   Linares et al.
2017/0037540 A1   2/2017   Narayan

OTHER PUBLICATIONS

Narayan et al., "Q-Carbon Discovery and Formation of Single-Crystal Diamond Nano- and Microneedles and Thin Films", Materials Research Letters, vol. 4, No. 2, Feb. 3, 2016, pp. 118-126.
Narayana et al., "Novel Phase of Carbon, Ferromagnetism, and Conversion Into Diamond", Journal of Applied Physics, vol. 118, No. 21, 2015, 13 pages.
PCT/US2018/035374 , "International Search Report and Written Opinion", dated Sep. 27, 2018, 6 pages.

\* cited by examiner

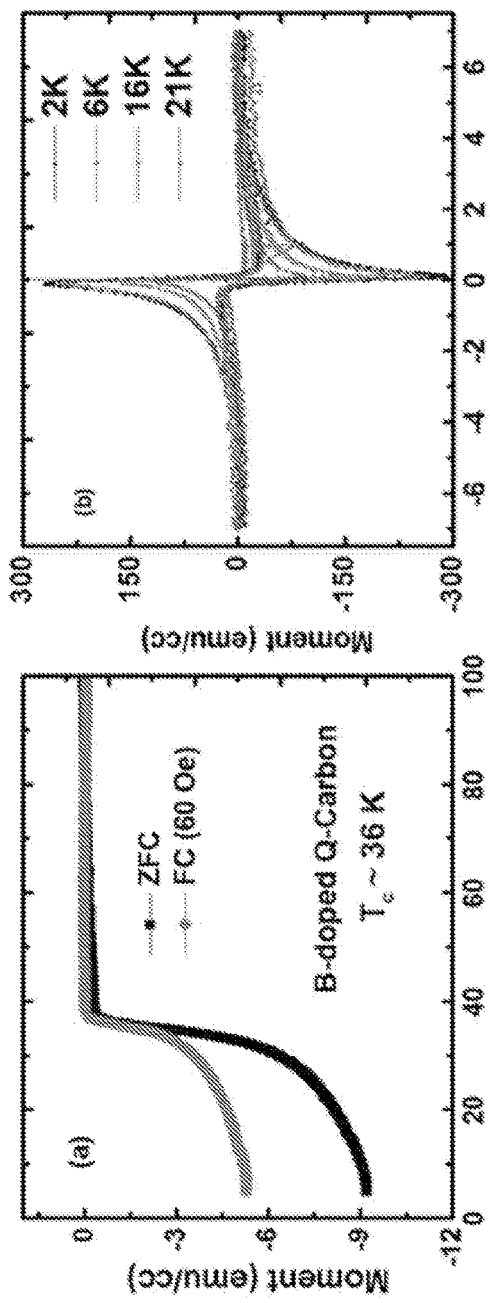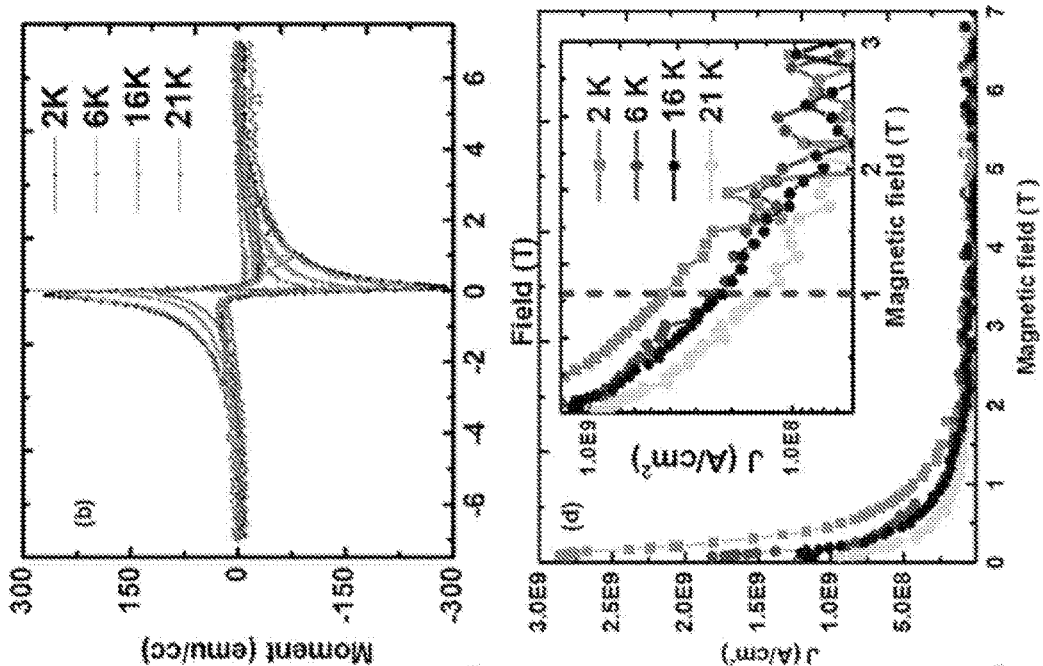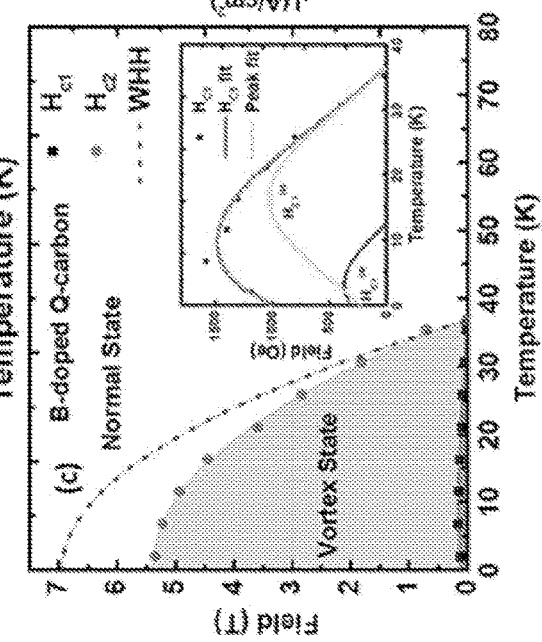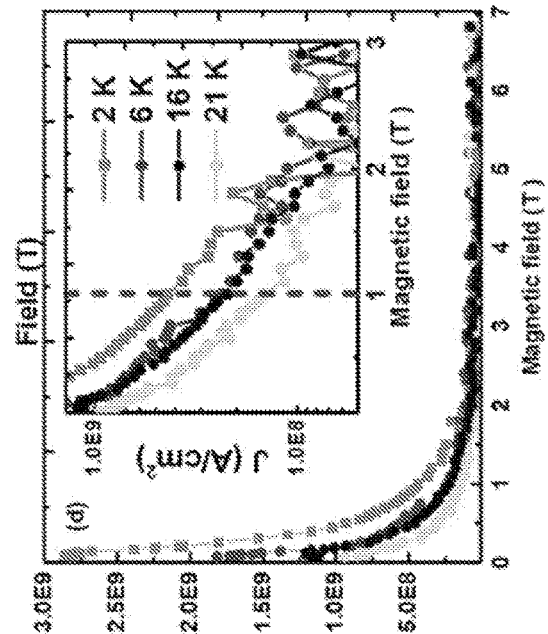
FIGURE 6A
FIGURE 6B
FIGURE 6C
FIGURE 6D

HIGH-TEMPERATURE CARBON-BASED SUPERCONDUCTOR: B-DOPED Q-CARBON

CROSS-REFERENCE TO RELATED APPLICATIONS

This application is a U.S. national phase of International Application PCT/US2018/035374 filed May 31, 2018, which claims priority to U.S. Provisional Application No. 62/513,026, titled "High-Temperature Carbon-Based Superconductor: B-Doped Q-Carbon" and filed May 31, 2017, the entirety of each of which is hereby incorporated by reference herein.

GOVERNMENT LICENSE RIGHTS

This invention was made with government support under grant number 1560838, awarded by the National Science Foundation. The government has certain rights to this invention.

TECHNICAL FIELD

The present disclosure relates generally to carbon and more specifically (although not necessarily exclusively) high-temperature superconductivity in B-doped Q-Carbon.

BACKGROUND

In some instances, carbon can be converted into various other forms (e.g., into diamond) using one or more techniques or processes and the converted carbon can be used in various applications including, for example, abrasive powders, protective coatings, display devices, biomedical and electronic applications, photonics, etc.

SUMMARY

Various embodiments of the present disclosure provide systems and methods for forming or creating high-temperature superconductivity in B-doped Q-Carbon.

In one example, a method includes depositing a first layer of boron and a second layer of amorphous carbon on a substrate. The method also includes melting the first layer of boron and the second layer of amorphous carbon by a laser pulse to form a melted boron-doped amorphous carbon. The method further includes quenching the melted boron-doped amorphous carbon to create a quenched boron-doped amorphous carbon comprising a mixture of sp3 bonded carbon atoms and sp2 bonded carbon atoms and having a higher superconducting transition temperature than diamond.

Additional features and advantages of exemplary embodiments of the present disclosure will be set forth in the description which follows, and in part will be obvious from the description, or will be learned by the practice of such exemplary embodiments. The foregoing summary is not an extensive overview, and it is not intended to identify key elements or indicate a scope. Rather the foregoing summary identifies aspects of embodiments as a prelude to the detailed description presented below.

BRIEF DESCRIPTION OF THE DRAWINGS

FIG. 6A is a graph depicting an example of magnetic moment versus temperature plots of B-doped Q-carbon thin film according to some aspects.

FIG. 6B illustrates the magnetic moment versus applied magnetic field plots at different temperatures (below $T_c$) in B-doped Q-carbon thin film according to some aspects.

FIG. 6C depicts upper critical field and lower critical field in B-doped Q-carbon thin films, along with the Werthamer-Helfand-Hohenberg (WHH) curve according to some aspects.

FIG. 6D depicts critical current density versus applied magnetic field at various temperatures according to some aspects.

DETAILED DESCRIPTION

Figure 1A:
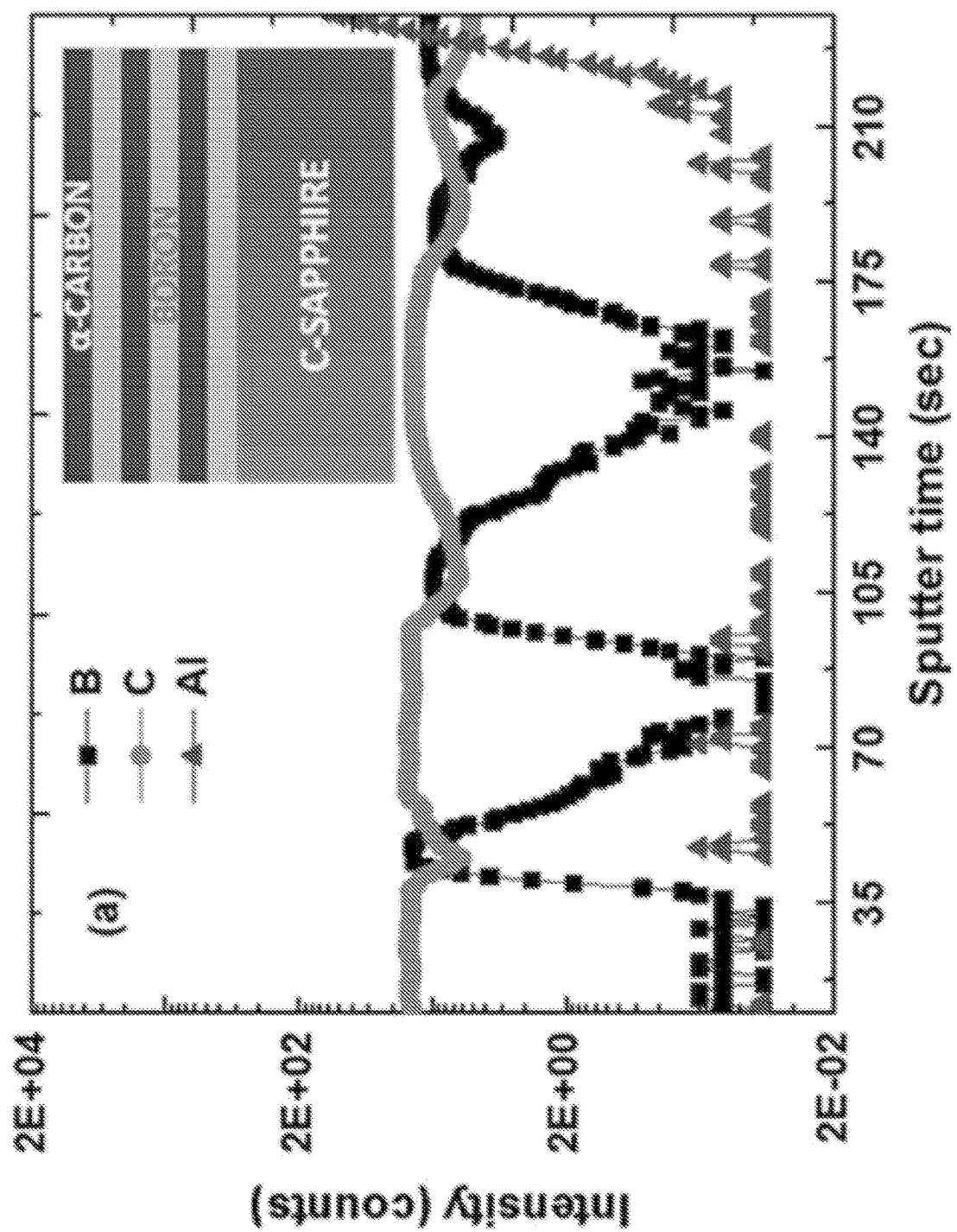
FIG. 1A is a graph depicting an example of Time of flight-Secondary ion mass spectroscopy (TOF-SIMS) of as-deposited B—C Q-carbon thin films according to some aspects.

Embodiments described herein relate to high-temperature superconductivity in B-doped Q-carbon is described, including detailed structure-property correlations to understand the origin of superconductivity in strongly bonded materials and methods to further enhance the superconducting transition temperature ($T_c$). Nanosecond melting of carbon in a super undercooled state and rapid quenching result in strongly bonded phase of B-doped Q-carbon. The temperature-dependent magnetic susceptibility measurements can demonstrate a type II superconductivity in this material with a transition temperature of 36.0±0.5 K and upper critical field of 5.4 T at 0 K. The super conducting transition temperature can increase from 37K to 55K and higher (e.g., above 100K) with increasing B concentration in B-doped Q-carbon. In some examples, in B-doped Q-carbon, the upper critical magnetic field ($H_{c2}(T)$) follows $H_{c2}(0) [1-(T/T_c)^{2.11}]$ temperature dependence and is consistent with the Bardeen-Cooper-Schrieffer formalism. In some examples, B-doped Q-carbon thin films can be formed on sapphire substrates by employing pulsed laser annealing using a nanosecond excimer laser. This process can involve the rapid quenching of highly undercooled melt of homogenously mixed B and C. Through the structure-property correlation measurements in B-doped Q-carbon, a higher electronic density of states can be estimated near the Fermi level. Higher density of states near the Fermi-level along with higher Debye temperature and phonon frequency can be responsible for enhanced $T_c$.

In some examples, as a result of rapid melting and quenching, 17.0±1.0 or higher atomic % of B in the electrically active sites of Q-carbon can be achieved, which leads to the formation of shallow electronic states near the valence band maximum. From the critical current density versus field moments, the value of critical current density ($J_c(2T)$) in B-doped Q-carbon at 21 K can be $4.3 \times 10^7$ Acm$^{-2}$, which can indicate that this material can be used for the persistent mode of operation in magnetic resonance imaging (MRI) and nuclear magnetic resonance (NMR) applications. In some examples, such high-temperature superconductivity in B-doped amorphous Q-carbon can show that non-equilibrium synthesis technique using super undercooling process can be used to fabricate materials with enhanced physical properties.

In some embodiments, the versatility in the arrangements of C atoms to form various allotropes and phases can lead to the discovery of several structures with various properties such as, for example, the evolution of superconductivity in the carbon-based materials. In some instances, high-temperature superconductivity can be achieved in the structures with strongly-bonded light C atoms due to the large Debye frequency. However, the lack of strong electron-phonon coupling and electronic density of states near the Fermi level in the pure C structures can limit achieving higher superconducting transition temperatures ($T_c$). The superconductivity can be observed in carbon-based materials, e.g. graphite intercalated superconductors ($T_c$~15 K), single-walled carbon nanotubes ($T_c$~15 K), alkali doped fullerenes ($T_c$~40 K), B-doped diamond ($T_c$~11 K), etc. Superconductivity in the bulk B-doped diamond may be limited to 11 K, where it is caused by a strong electron-phonon mediated pairing of the charge carriers, which can be established by the Bardeen-Cooper-Schrieffer formalism.

Superconductivity in boron-doped diamond is a studied subject due to its broad applications in electronics. It can be shown experimentally that $T_c$ ranging from 4 K to 11 K can be achieved in B-doped diamond with increasing boron concentration in substitutional lattice sites of diamond. In some examples, without considering the electronic compensating defects, $T_c$ in B-doped diamond can be increased up to 55 K with approximately 25 atomic % B and up to 100 K and higher with approximately 50 atomic % B. Increasing the concentration of B dopant (n>$10^{20}$ cm$^{-3}$) decreases the activation energy and it exhibits a metal-like behavior. Achievement of such higher concentrations by equilibrium Chemical Vapor Deposition (CVD) methods can be a challenge. Therefore, non-equilibrium methods based upon energetics of plasma and lasers, are needed to attain concentration beyond the thermodynamic solubility limits. However, some studies also indicate that the B atoms, beyond the solubility limits generate strains and form dimers in the B-doped diamond. This pairing can lead to the symmetric and anti-symmetric combinations of bound states of B, which do not contribute to the density of states at the Fermi level, and adversely affect the value of $T_c$. This can be a challenge in improving the superconducting properties of B-doped diamonds, grown by CVD based techniques. The CVD process can be close to an equilibrium synthesis method and it restricts the B-doping in substitutional sites above the thermodynamic solubility limits, which is about 2.0 at % in diamond.

Non-equilibrium processes, such as pulsed laser deposition, pulsed laser annealing, plasma enhanced CVD and ion implantation, may allow dopant concentration exceeding the thermodynamic solubility limits. Some embodiments of the present disclosure can involve doping by non-equilibrium laser quenching. In some examples, the amorphous/disordered counterparts of the crystalline phases can exhibit higher $T_c$. Recently, the reports indicate experimentally measured superconductivity in amorphous Bi ($T_c$=6 K) which is higher than that in crystalline Bi ($T_c$=53 mK). This can be due to the increased number of electronic density of states near the Fermi level and strong electron-phonon coupling in amorphous Bi. In some instances, the mobility of the Cooper pairs in amorphous structure is not hindered by the transition from semi-metallic to metallic behavior of Bi during the amorphization process. Based on various studies and theoretical predictions, a class of strongly bonded carbon-based amorphous materials can be created, where dopant concentration can be exceeded beyond thermodynamic limits.

In some instances, the formation of a phase of carbon (Q-carbon) can been accomplished by melting of carbon layers in a super undercooled state by using pulsed laser annealing and subsequent quenching of molten carbon layers. Upon pulsed laser irradiation, electrons are excited into the conduction band and these excited electrons transfer their energy quickly into phonons, leading to rapid heating and melting. Depending on the laser energy density, physical properties of the amorphous film and the substrate, a process of super undercooling and quenching takes place which leads to the formation of metastable state of amorphous Q-carbon structure possessing various properties. High $T_c$ in strongly-bonded materials can be achieved if doping is high enough to sustain a moderate electron-phonon coupling. Q-carbon includes a phase mixture of $sp^3$ (>80%) and $sp^2$ bonded C atoms and exhibits interesting properties, such as low electron affinity in electric field, room temperature ferromagnetism, etc. Undoped Q-carbon can show room-temperature ferromagnetism with a Curie temperature above 500 K. Upon doping with B, Q-carbon can turn diamagnetic and exhibit high-temperature superconductivity with $T_c \geq 36$ K. The nanosecond pulsed laser annealing can be used on the B/amorphous C multilayer structures to synthesize B-doped Q-carbon. The structure, properties and distribution of B atoms in Q-carbon can be characterized by various nanoscopic and microscopic spectroscopic techniques, such as Secondary ion mass spectroscopy (SIMS), electron energy-loss spectroscopy (EELS), energy dispersive spectroscopy (EDS) in a scanning transmission electron microscope (STEM), Raman spectroscopy, Scanning electron microscopy (SEM), and X-ray photoelectron spectroscopy (XPS). The superconductivity behavior of B-doped Q-carbon can be examined using the temperature-dependent magnetic susceptibility measurements in superconducting quantum interference device (SQUID). Some embodiments described herein can involve high-temperature superconductivity in B-doped Q-carbon. Some embodiments of the present disclosure describe details of laser-solid interaction modeling and melting, experimental procedures, critical current versus temperature, temperature versus field and possibilities of higher $T_c$>37 K with boron concentration. In addition, certain embodiments of the present disclosure describe the origin and nature of superconductivity in B-doped Q-carbon. In some embodiments, non-equilibrium undercooling assisted synthesis methods described herein can be used to fabricate highly doped materials, which can have enhanced superconducting properties.

In some embodiments, alternating layers of boron and amorphous carbon thin films can be deposited onto c-sapphire using pulsed laser deposition with a thickness ranging from 100-500 nm in the temperature range of 30-300° C. and 1.0E-06 torr operating pressure. The pulsed laser beam can be rastered through the glassy carbon and B (sector) targets mounted on the same target holder during the growth process. Subsequently, these B-doped amorphous carbon thin films can be irradiated with nanosecond ArF excimer laser (laser wavelength=193 nm, pulse duration=20 ns) using laser energy density 0.6-1.0 $Jcm^{-2}$. The pulsed laser annealing technique can melt the B-doped carbon film in a highly super undercooled state, and quenched rapidly to complete the whole process within 200-250 ns. In some examples, this can lead to conversion of amorphous carbon films into B-doped quenched carbon structure where B can be doped beyond thermodynamic solubility limit.

In some examples, the characterization of the B-doped Q-carbon phase can be carried out using Raman spectroscopy, XPS, SIMS, EELS, FESEM, and SQUID magnetometry. In some examples, an Alfa300 R superior confocal Raman spectroscope with a lateral resolution less than 200 nm can be employed to characterize the Raman-active vibrational modes. In some instances, crystalline Si can be used to calibrate the Raman spectra, which has its characteristic Raman peak at 520.6 $cm^{-1}$. High-resolution SEM with sub-nanometer resolution can be carried out using FEI Verios 460L SEM to characterize the as-deposited and the laser-irradiated films. The B atoms can be incorporated into Q-carbon during rapid liquid-phase growth and solute trapping, where dopant concentrations can exceed far beyond the thermodynamic solubility limits. High-resolution SEM measurements can be carried out using the field emission mode in FEI Verios 460L SEM. Time-of-Flight Secondary Ion Mass Spectrometer (TOF-SIMS) with a lateral resolution of <300 nm can be used to detect the presence of C, O, B, Al and other trace impurity elements in the B-doped Q-carbon thin films. XPS with X-ray energy 10-14 kV for Al/Mg and Al/Ag sources employing superior analyzer (PHOIBOS 150) having <1 eV resolution can be used for the collection of XPS data. FEI Quanta 3D FEG with dual beam technology employing both electron and ion beam guns can be used for preparing cross-sectional TEM samples. A low energy ion beam (5 kV, 10 pA) can be used to cleanup the FIB surface damage. Aberration-corrected STEM-FEI Titan 80-300 can be used in conjunction with electron energy-loss spectroscopy (EELS with a resolution of 0.15 eV) to acquire HAADF images and EELS spectra of B-doped Q-carbon thin films. In some examples, a 38±2 pA electron probe current can be used. In some examples, EELS data can be acquired with a collection angle of 28 mrads. Quantum design magnetic property measurement system (MPMS3) can be used to measure magnetic properties of thin films. VSM and DC modes can be used for measuring field and temperature-dependent magnetization. Magnetic measurements can be made with samples mounted parallel to the magnetic field. Temperature-dependent resistivity measurements can be carried out in the physical property measurement system (PPMS) at zero magnetic field.

Figure 1B:
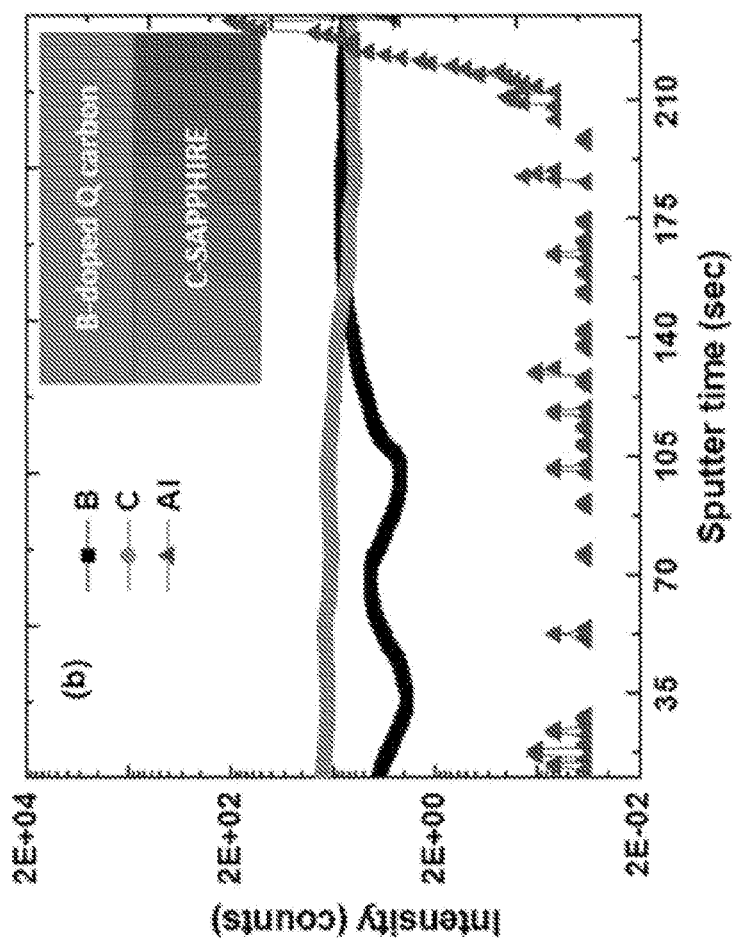
FIG. 1B is a graph depicting an example of TOF-SIMS of as-deposited B-doped Q-carbon thin films according to some aspects.

Referring now to the drawings, FIGS. 1(a) and 1(b) are each graphs depicting examples of Time of flight-Secondary ion mass spectroscopy (TOF-SIMS) of as-deposited B—C and B-doped Q-carbon thin films, respectively, according to some aspects. FIG. 1A shows SIMS profiles of as-deposited boron and carbon layers and the inset included in FIG. 1A shows a schematic of the alternating layers of amorphous carbon and boron deposited on c-sapphire using a pulsed laser deposition technique. As depicted in FIG. 1A, there can be alternating layers of B and amorphous carbon in the as-deposited thin films. The as-deposited layered thin films can be engineered to have a top amorphous carbon layer. This can result in an enhanced laser coupling that can be due to low reflectivity and high absorption of amorphous carbon as compared to metallic B at 193 nm. In some instances, effective coupling can be used during the pulsed laser annealing (PLA) process to cause melting and subsequent quenching to form B-doped amorphous Q-carbon structures. The C and B concentration profiles in the as-deposited sample exhibit periodic variation. However, after the pulsed laser annealing B and C concentration profiles are uniform, as shown in FIG. 1B.

FIG. 1B depicts pulse laser annealed (B-doped Q-carbon) thin films and the inset included in FIG. 1B shows a schematic of the B-doped amorphous Q-carbon formed after a pulsed layer annealing technique. In the example depicted in FIG. 1B, high-energy laser photons cause an avalanche of electrons in the conduction band which interact with phonons, thereby melting amorphous carbon and B composite layers. The high concentration of free electrons caused by laser excitation can lead to a non-equilibrium phase transition with a considerable modification of the interatomic bonding. The energy can be transferred from the excited electrons to phonons thereby causing a homogeneous melting of the laser annealed region. During this melting process, the B dopants diffuse into molten Q-carbon to form a homogeneous mixture. The PLA process can be completed in less than 200 ns, the details of which are described herein (e.g., via a laser-solid interaction and melting mechanism). Using the two-dimensional diffusion equation [$X=2(D*t)^{0.5}$], the diffusivity coefficient (D) is calculated as approximately 2E-04 cm$^2$/sec. In some instances, this can indicate that liquid phase diffusivity of B into Q-carbon occurs during the PLA process. The liquid phase diffusivity can help the formation of homogeneous B-doped Q-carbon, with B concentrations exceeding thermodynamic solubility limits of 2.0 at % in diamond. Higher B concentration can be crucial for superconductivity in this material. The results from SIMS spectra can also indicate that the as-deposited and PLA samples do not contain any impurities within a resolution of a few ppm.

Figure 2A:
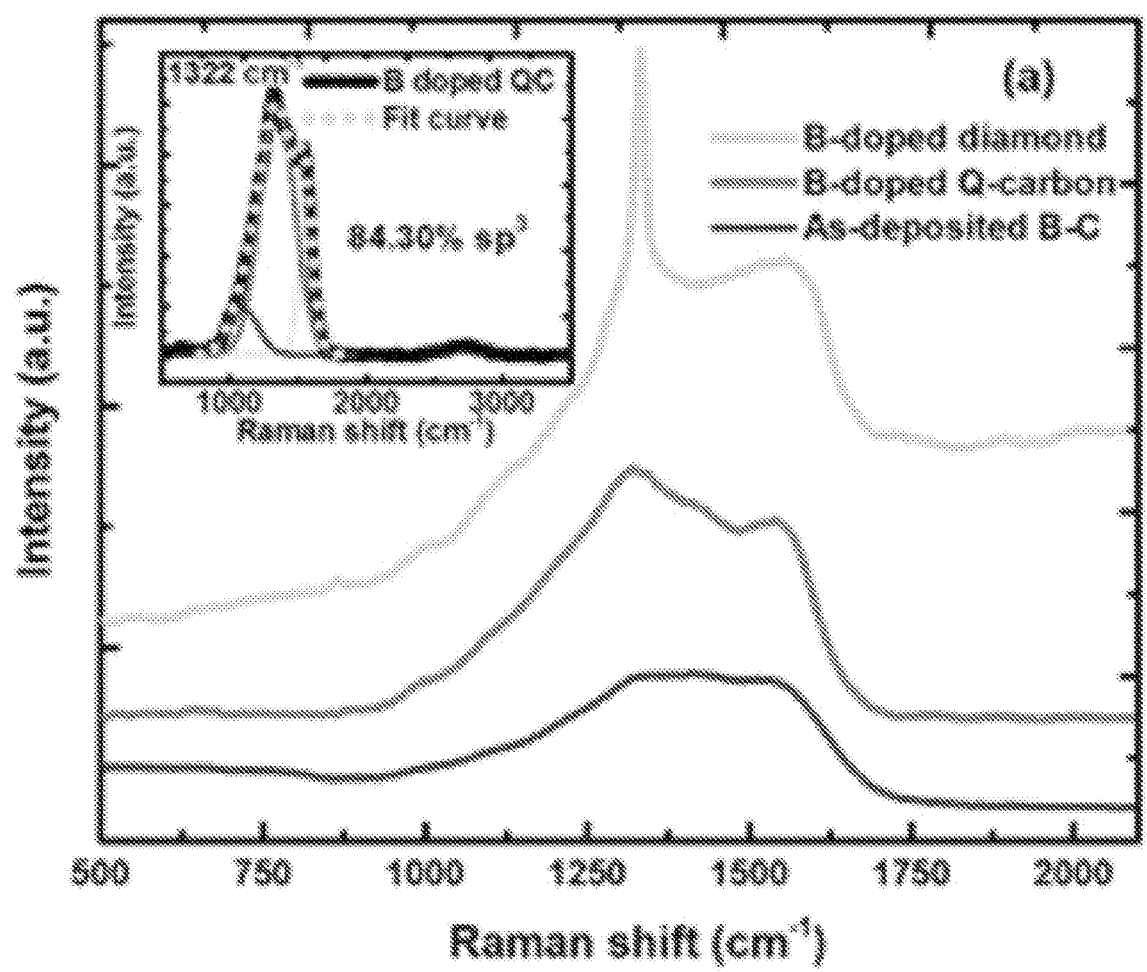
FIG. 2A a graph depicting an example of unpolarized Raman spectroscopy of as-deposited B—C, B-doped Q-carbon, and Hot Filament Chemical Vapor Deposition (HFCVD) grown B-doped diamond according to some aspects.

FIG. 2A is a graph depicting an example of an unpolarized Raman spectroscopy of as-deposited B—C, B-doped Q-carbon, and HFCVD grown B-doped diamond (formed from B-doped Q-carbon) using 532 nm as the excitation source according to some aspects.

In some examples, there can be a considerable increase in the sp$^3$ fraction in PLA B-doped Q-carbon (85% or 84.3%) as compared to as-deposited B—C sample (70%). The inset in FIG. 2A shows the fitted cumulative curve in B-doped Q-carbon from which the sp$^3$ fraction can be extracted. In the range of 900-2000 cm$^{-1}$, the spectrum can be deconvoluted into three Raman-active vibrational modes centered at 1105 cm$^{-1}$, 1322 cm$^{-1}$, and 1567 cm$^{-1}$. The peak centered at 1105 cm$^{-1}$ corresponds to the sp$^2$ dangling bonds on the surface of nanodiamonds. The unsaturated sp$^2$ bonds are predominantly seen in nanodiamonds as compared to microdiamonds or large area single crystal diamonds. The second and third peaks correspond to the presence of nanodiamonds and graphitic entities (G peak), respectively. The undoped phase of Q-carbon, which is formed by nanosecond laser irradiation and subsequent quenching process, contains 75-85% sp$^3$ bonding. The sp$^3$ fractions calculated in B-doped Q-carbon superconducting thin films after curve fitting can vary from approximately 83-86%. The low intensity of the G peak can be indicative of less graphitization in B-doped Q-carbon samples. The HFCVD prepared B-doped diamond by using B-doped Q-carbon as a template has a sharp diamond peak centered at 1331 cm$^{-1}$ and a graphitic hump at 1557 cm$^{-1}$. B-doped Q-carbon thin films have nuclei of B-doped diamond which grow during the HFCVD process. This can lead to the formation of B-doped diamond at lower temperatures and time as compared to previously reported CVD synthesized B-doped diamond.

In some examples, due to the presence of quantum mechanical interference between the zone-center Raman active optical phonon and the continuum of electronic states created by B atoms, there occurs an asymmetry and red-shift of the diamond peak in the B-doped Q-carbon thin films. In the case of B-doped polycrystalline diamond samples, there are vibrational modes between 475 and 1225 cm$^{-1}$ which can be due to maximas in the phonon density of states (PDOS). These peaks in B-doped diamond thin films can indicate distortion and the presence of defects in the diamond lattice. In some instances, these peaks can originate from local vibrational modes of B pairs present in the interstitial sites. High-resolution Raman spectroscopy of B-doped Q-carbon thin films can show the absence of these peaks, which may indicate B doping in electrically active sites of Q-carbon. The vibrational mode centered at approximately 500 cm$^{-1}$ in B-doped diamond may indicate the presence of B pairs in the interstitial sites of the diamond. This can cause a distortion of the hole-hole interaction at lower temperatures, thereby reducing T$_c$ in B-doped diamond to 25.0±0.5 K from 36.0±0.5 K in B-doped Q-carbon.

Figure 2B:
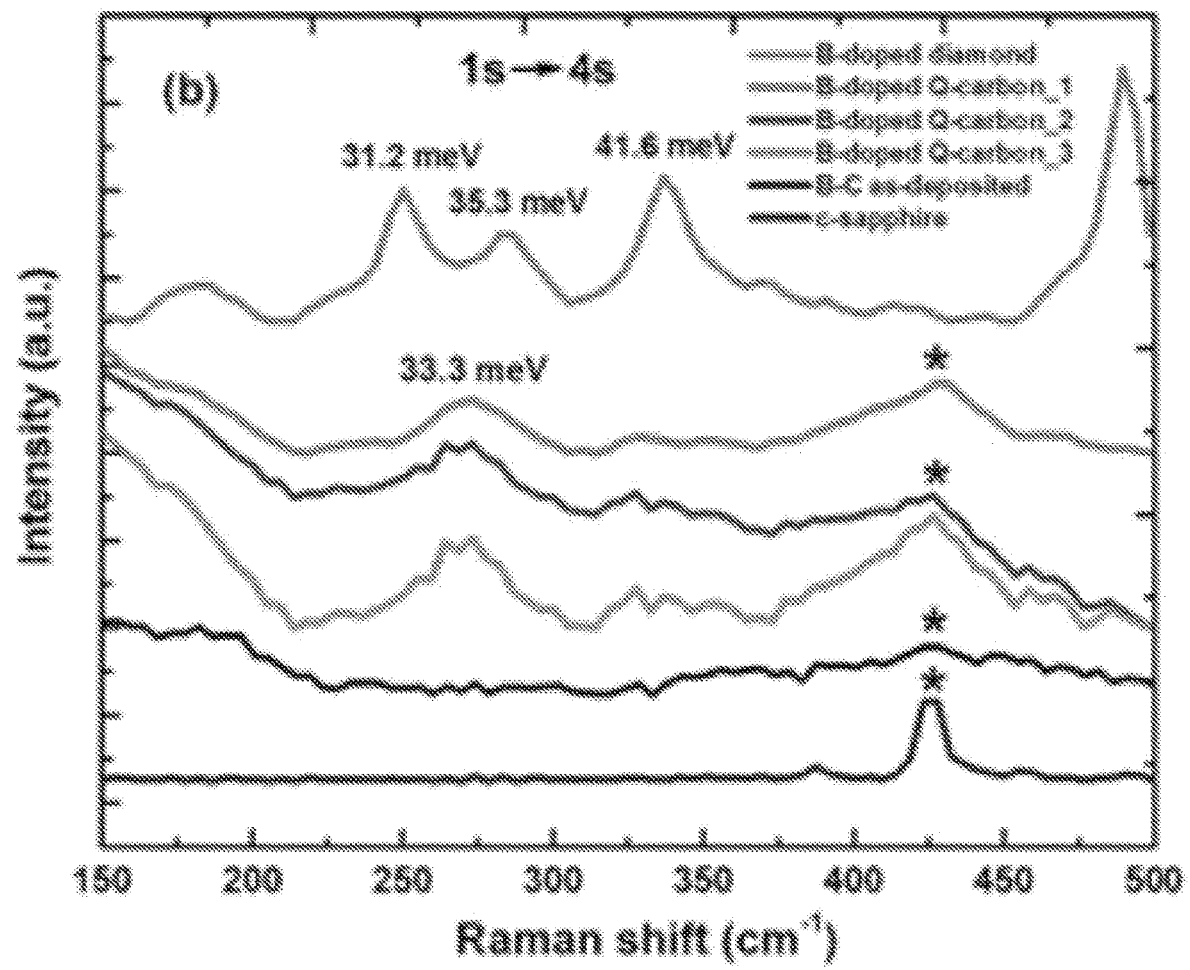
FIG. 2B is a graph depicting an example of electronic Raman spectra of B-doped Q-carbon, as-deposited B—C, B-doped diamond (by HFCVD), and c-sapphire substrate according to some aspects.

FIG. 2B is a graph depicting an example of electronic Raman spectra of B-doped Q-carbon, as-deposited B—C, B-doped diamond (by HFCVD), and c-sapphire substrate according to some aspects. In this example, the results show a distinct shallow acceptor energy level at 33.3 meV in B-doped amorphous Q-carbon, as compared to a value of 37.0 meV in heavily B-doped crystalline diamond.

As shown in the exampled depicted in FIG. 2B, there are no electronic Raman transitions from 150-400 cm$^{-1}$ in c-sapphire (substrate) and as-deposited B—C thin films. In the B-doped diamond thin films, there can be various electronic transitions at 31.2 meV, 35.3 meV, and 41.6 meV. For example, the first transition at 31.2 meV corresponds to 1s to 3s electronic transition, whereas the other two correspond to 1s to 4s transition. In some instances, at low B concentrations (<1E18 cm$^{-3}$), the electronic transitions pertaining to only 1s($p_{3/2}$)→1s($p_{1/2}$) can occur. This transition can be seen in extremely low-concentration B-doped diamond samples at approximately 16 cm$^{-1}$. In some examples, Lyman series electronic transitions corresponding to 1s to 4s transitions, for example, can be predominantly seen in heavily B-doped diamond samples. There also occurs spin-orbit splitting (formation of $p_{3/2}$ and $p_{1/2}$) of the acceptor states whose value linearly increases with the increase in principal quantum number. The value of spin-obit splitting in B-doped Q-carbon can be approximately 7 meV as compared to approximately 6 meV in B-doped diamond and approximately 6.3 meV in HFCVD B-doped diamond. This coupling can cause a considerable overlap of the electronic acceptor states thereby increasing the density of the electronic density of states near the Fermi energy level. The schematic of electronic transitions and the energy levels are shown in FIG. 2C.

Figure 2C:
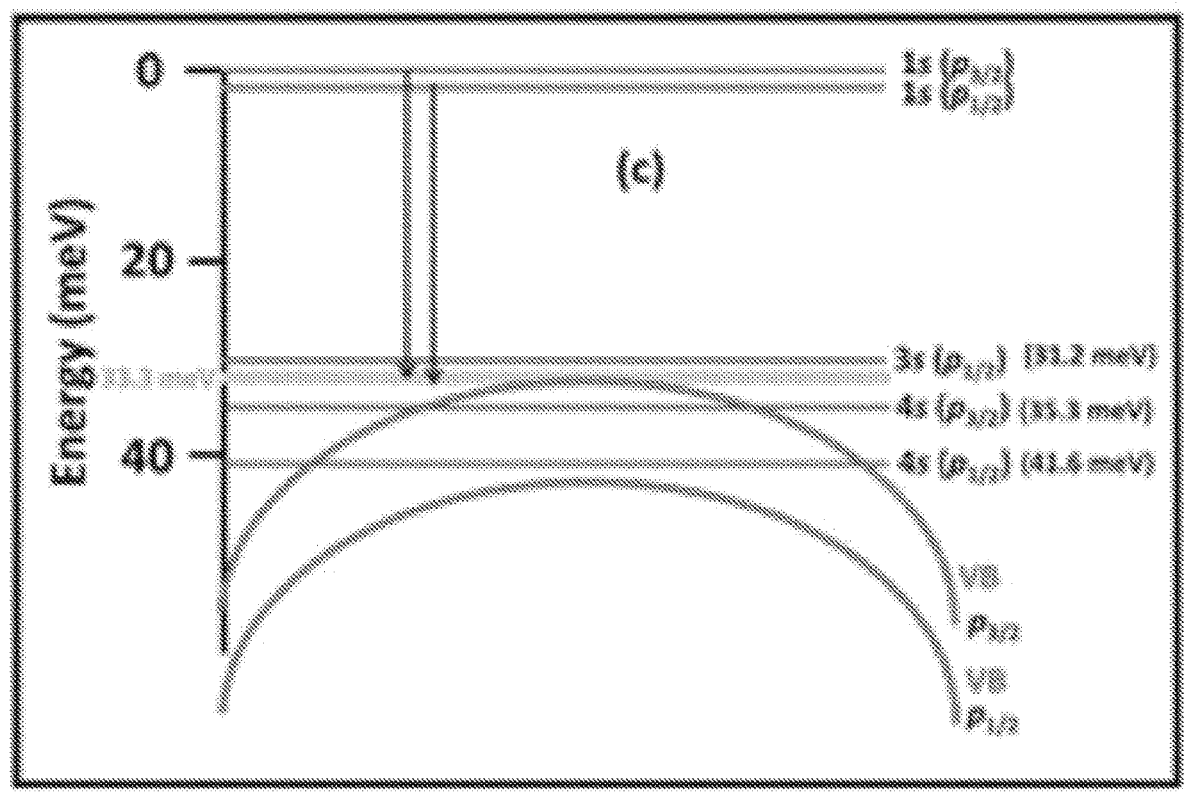
FIG. 2C is a graph depicting an example of the energy-level schematic diagram of B acceptor states in B-doped Q carbon and B-doped diamond according to some aspects.

FIG. 2C is a graph depicting an example of the energy-level schematic diagram of B acceptor states in B-doped Q carbon and B-doped diamond according to some aspects. In this example, the presence of a shallow acceptor state at approximately 37 meV and approximately 6 meV spin-orbit splitting of the valence band in B-doped diamond can cause superconductivity in B-doped diamond. This acceptor state can be associated with the formation of metallic B—C nanosheets. In B-doped Q-carbon, the formation of a shallow acceptor energy level at approximately 33 meV results from the enhanced B concentration, and it is situated near the valence band maximum. The spin-orbit splitting associated with this energy level is approximately 7 meV. This can cause an increase in the density of the electronic acceptor states near the Fermi level, which can lead to high T$_c$ superconductivity in B-doped Q-carbon. As compared to a value of the shallow acceptor state at approximately 37 meV in B-doped diamond (T$_c$=5 K), the HFCVD B-doped sample described herein show the presence of an acceptor state at 35.3 meV, situated close to the valence band maximum. The B-doping in Q-carbon introduces a phonon softening of the diamond-related zero-optical phonon peak (e.g., from 1332 cm$^{-1}$ in diamond to 1322 cm$^{-1}$ in B-doped Q-carbon). A similar downshift can be observed in the case of B-doped diamond thin films, which is related to electron-phonon coupling thereby leading to superconductivity. The softening of phonon modes and the creation of new vibrational modes can also cause an increase in the T$_c$ of the HFCVD prepared B-doped diamond prepared using B-doped Q-carbon as the template.

Figure 3A:
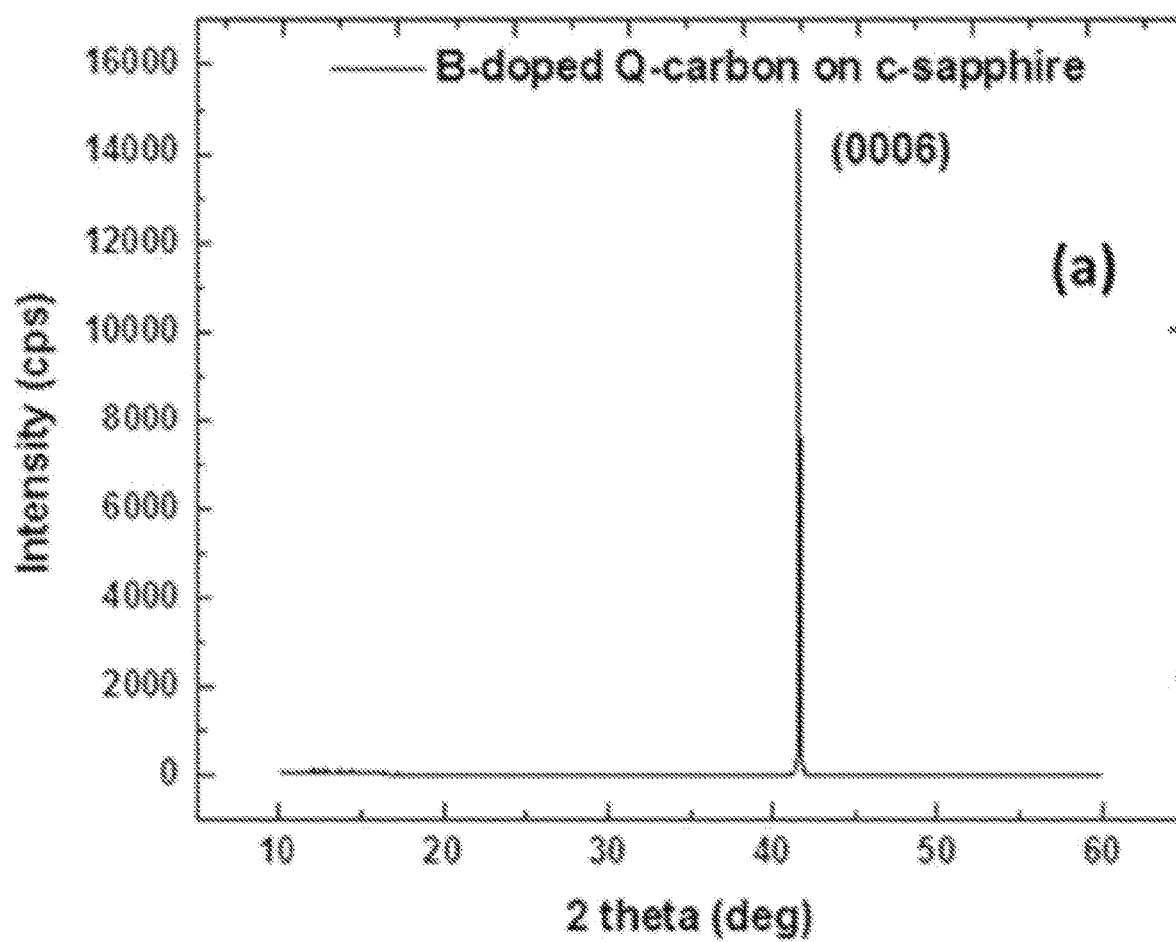
FIG. 3A is a graph depicting an example of an X-ray diffraction spectrum of B-doped Q-carbon according to some aspects.

FIG. 3A is a graph depicting an example of an X-ray diffraction spectrum of B-doped Q-carbon according to some aspects. In this example, the diffraction peak at 42.23° (2θ) corresponds to (0006) of the c-sapphire substrate. There are no impurity peaks in the x-ray scan, thereby indicating that the synthesized B-doped Q-carbon samples are pristine in nature. The spectrum depicted in FIG. 3A can also indicate that the B-doped Q-carbon is amorphous.

Figure 3B:
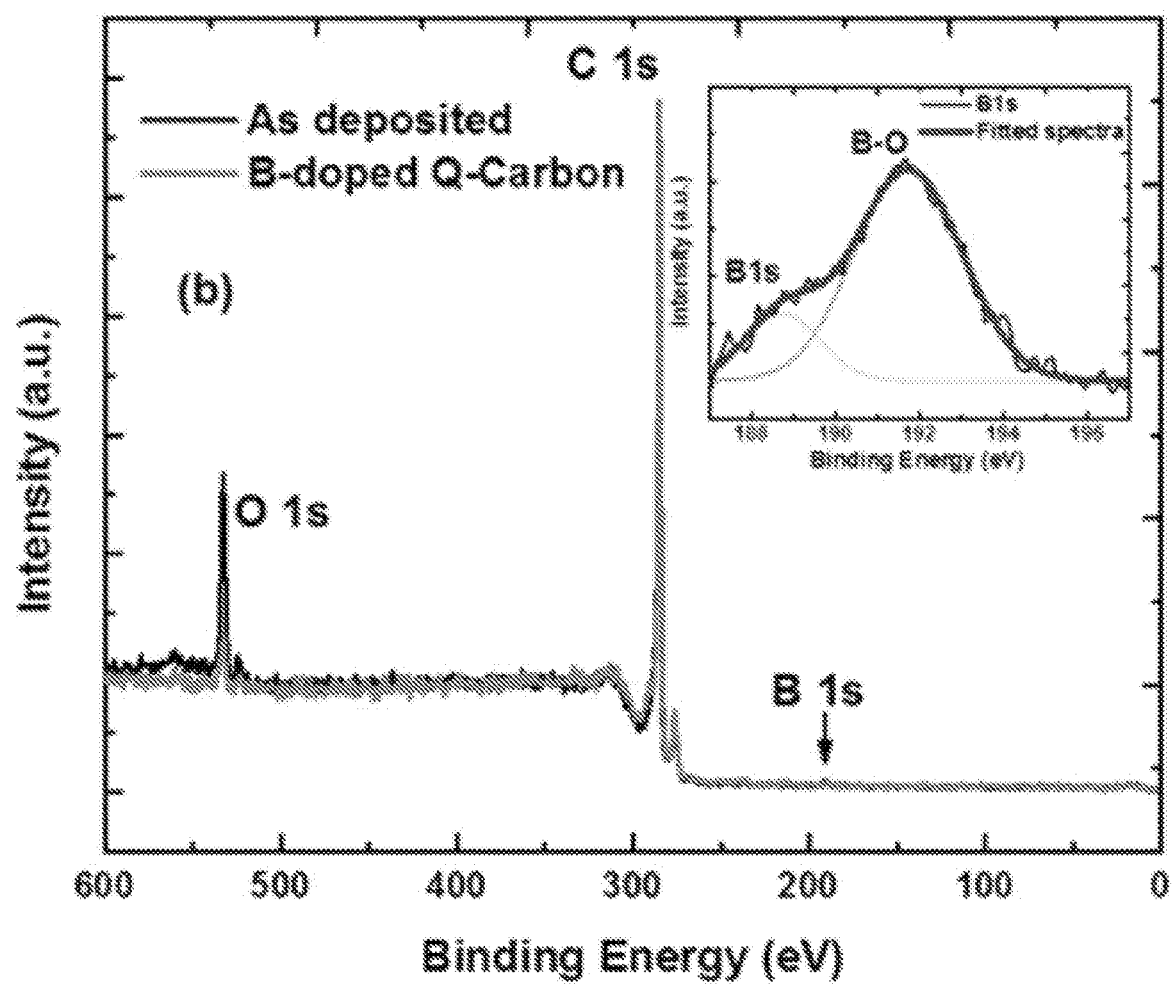
FIG. 3B is a graph depicting examples of X-ray photoelectron spectroscopy XPS survey scans of as-deposited and B-doped Q-carbon thin films according to some aspects.

FIG. 3B is a graph depicting examples of XPS survey scans of as-deposited and B-doped Q-carbon thin films according to some aspects. The example depicted in FIG. 3B illustrates high-resolution XPS scan showing the presence of B—O and B-1s peaks. The inset in FIG. 3B shows the high-resolution XPS scan of the PLA sample in the binding energy range 186-198 eV. In this example, there can be an increase in C/O ratio after laser annealing. In some instances, this can indicate a laser annealing assisted reduction process, where the oxygen-rich functional group carbon-based material is ablated off from the surface of the thin film. The absence of impurity peaks in the survey scan shows that the as-deposited as well as laser-annealed samples are largely impurity-free. Deconvolution of the high-resolution XPS scan in the range 188-196 eV gives rise to two peaks. The two peaks are centered at 188.5 eV and 192.0 eV can be attributed to B1s and B—O electronic state, respectively. In some instances, the strength of the peak centered at 192.0 eV can increase with oxidation (formation of $B^{3+}$). This peak in the PLA sample can indicate a presence of B—O electronic states near the surface. In some examples, since PLA is a laser-assisted reduction process, there can be a decrease in the volume fraction of oxygen present in the few surface layers. So, the amount of B—O present in the PLA samples may be too low to perturb the superconducting properties in the B-doped Q-carbon structure.

Figure 4A:
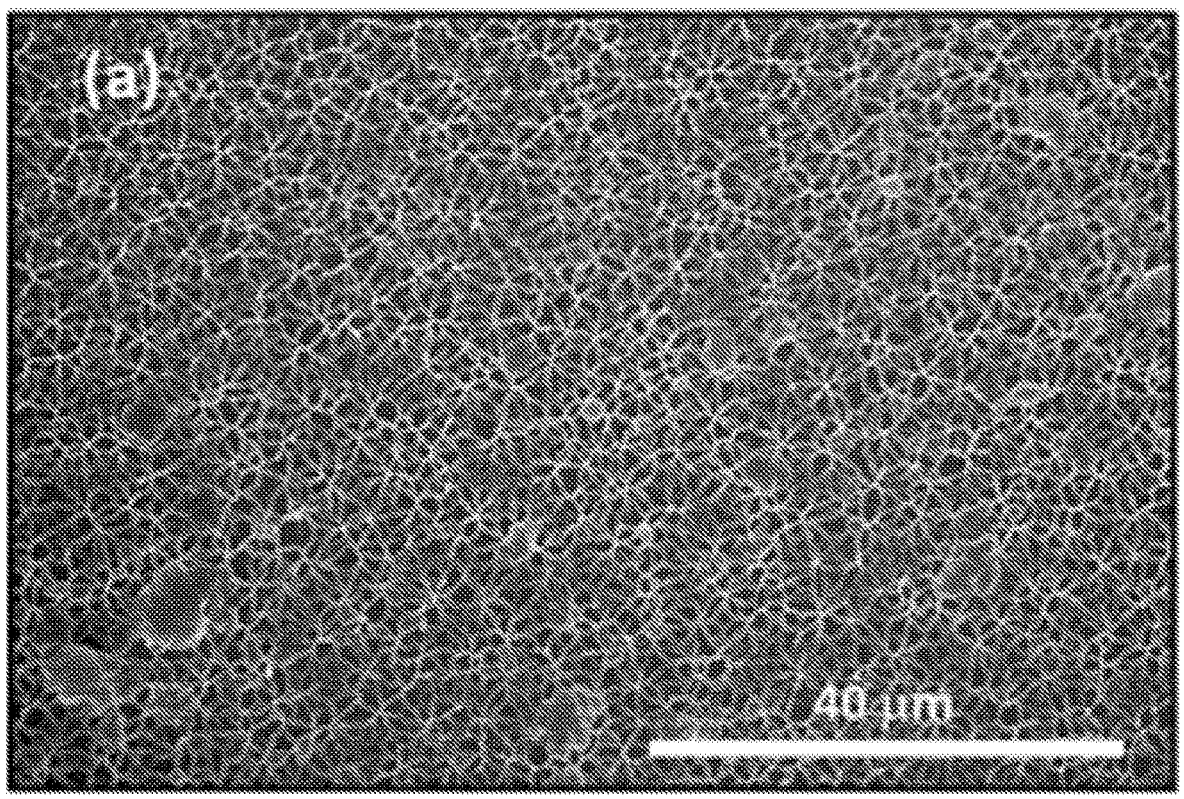
FIGS. 4A-B— are images depicting examples of high-resolution field emission scanning electron microscopy (FE-SEM) images of a B-doped Q-carbon sample according to some aspects.
Figure 4B:
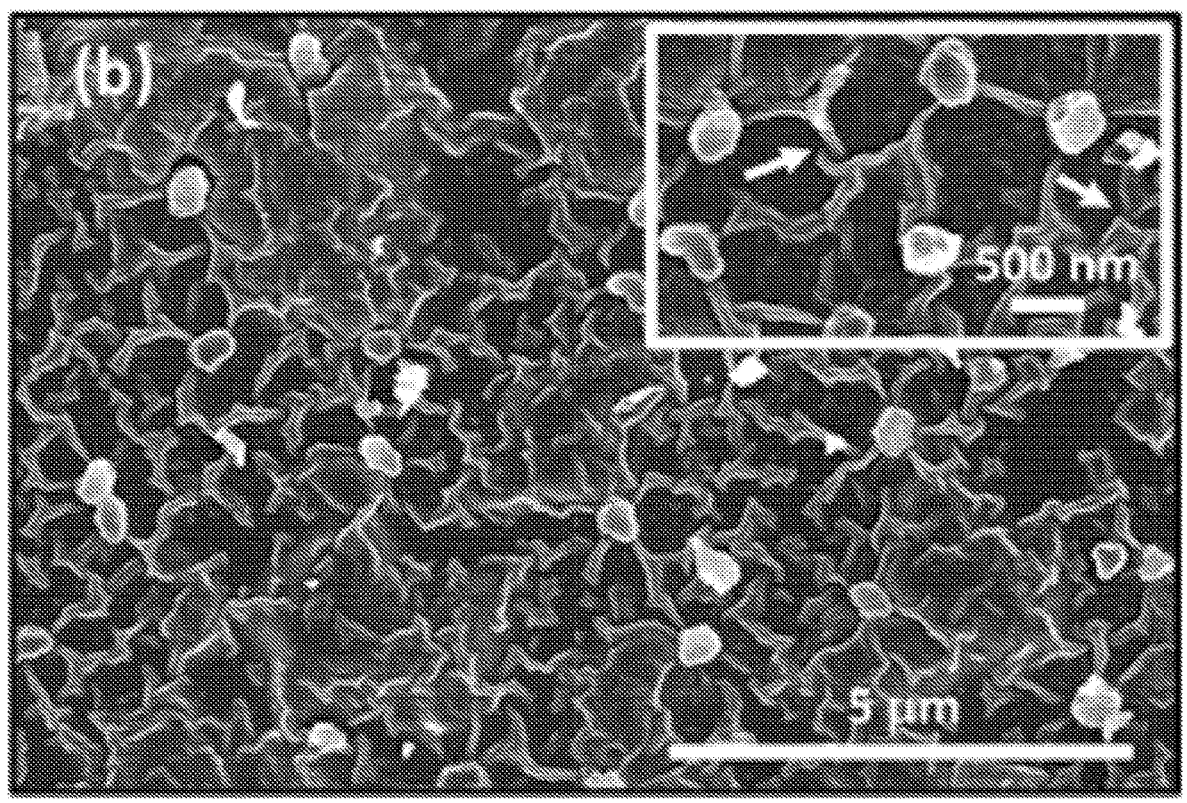

FIGS. 4(a)-(b) are each images depicting examples of high-resolution FESEM images of a B-doped Q-carbon sample according to some aspects. FIGS. 4(a)-(b) depict the filamentary structures of B-doped Q-carbon. In some examples, the filamentary structure can be formed due to interfacial instability during the super undercooling process by nanosecond ArF laser. Formation of nano-diamonds and micro-diamonds can be observed occasionally at the triple junctions and is shown in FIG. 4B. In some examples, the B-doped Q-carbon structures described herein can have a negative electron affinity and glow under the application of a stage bias. In some examples, reports on Q-carbon (using Kelvin probe force microscopy) can indicate a negative electron potential with respect to diamond-like carbon. The filamentary structures of the B-doped Q-carbon are disconnected, as shown by white arrows in the inset of FIG. 4B. Homogeneous and heterogeneous nucleation of diamonds can occur from Q-carbon thereby forming diamonds having <110> and <111> out of plane orientation, respectively.

Figure 4C:
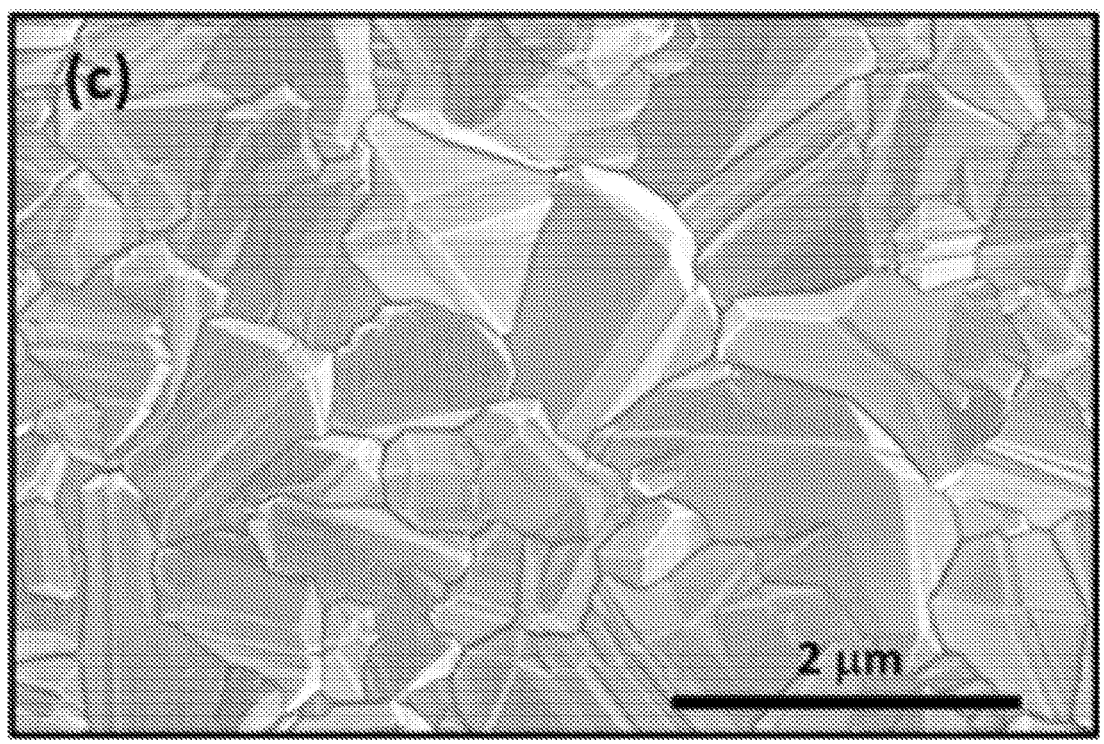
FIG. 4C depicts the FESEM image of B-doped diamond formed using HFCVD technique where the B-doped Q-carbon acts as a template according to some aspects.

FIG. 4C depicts the FESEM image of B-doped diamond formed using HFCVD technique where the B-doped Q-carbon acts as a template according to some aspects. As shown in the example depicted in FIG. 4C, the diamond crystallites can be oriented along <111> indicating heterogeneous nucleation of diamond from Q-carbon on (0001) sapphire substrate. The resulting B-doped diamond structures can have $T_c$ of 25.0±0.5 K, which is approximately 14 K higher than the B-doped diamond samples prepared by a plasma enhanced chemical vapor deposition (PECVD) technique. The detailed structural and property correlations of HFCVD prepared B-doped diamond from B-doped Q-carbon are described herein.

Figure 5A:
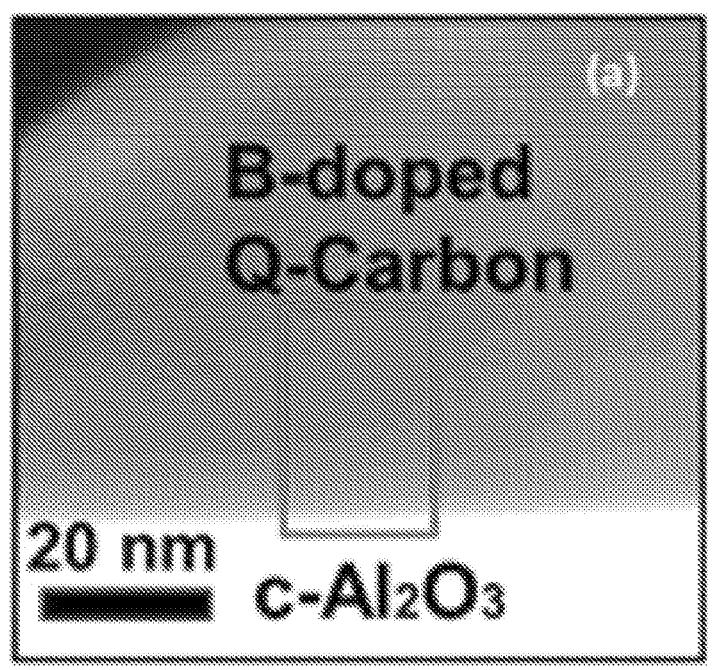
FIG. 5A depicts an example of a cross-sectional high-angle-annular dark field (HAADF) image of a B-doped Q-carbon on a c-sapphire substrate according to some aspects.

FIG. 5A depicts an example of a cross-sectional high-angle-annular dark field (HAADF) image of a B-doped Q-carbon on a c-sapphire substrate according to some aspects.

Figure 5B:
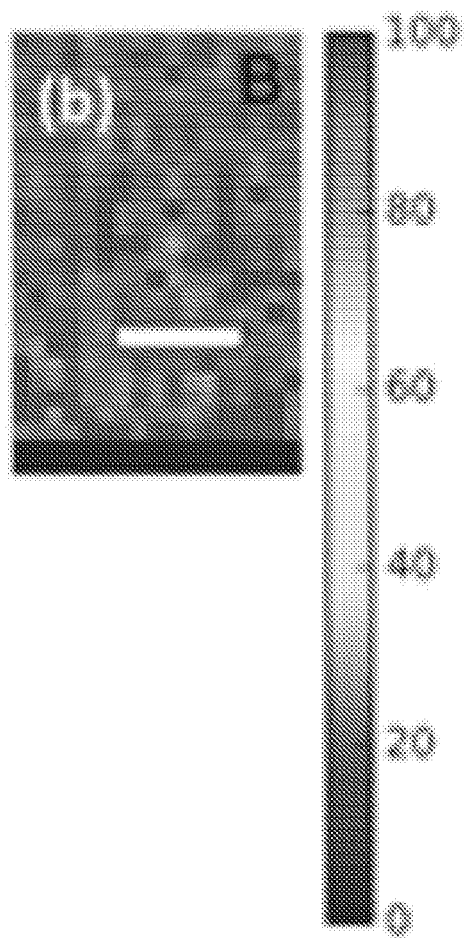
FIGS. 5B—C are each graphs depicting an example of boron electron energy-loss spectroscopy (B-EELS) mapping according to some aspects.
Figure 5C:
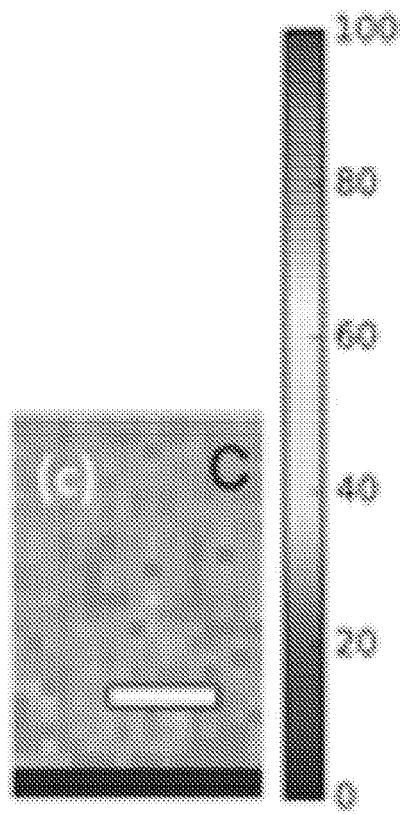

FIGS. 5(b)-(c) are each graphs depicting an example of B-EELS mapping according to some aspects. In some examples, the elemental maps of FIGS. 5(b)-(c), obtained by electron energy-loss spectroscopy (EELS), demonstrate the homogeneous distribution of B in Q-carbon throughout the analyzed region (in-boxed region in FIG. 5A), which is consistent with SIMS result (e.g., as depicted in FIG. 1).

Figure 5D:
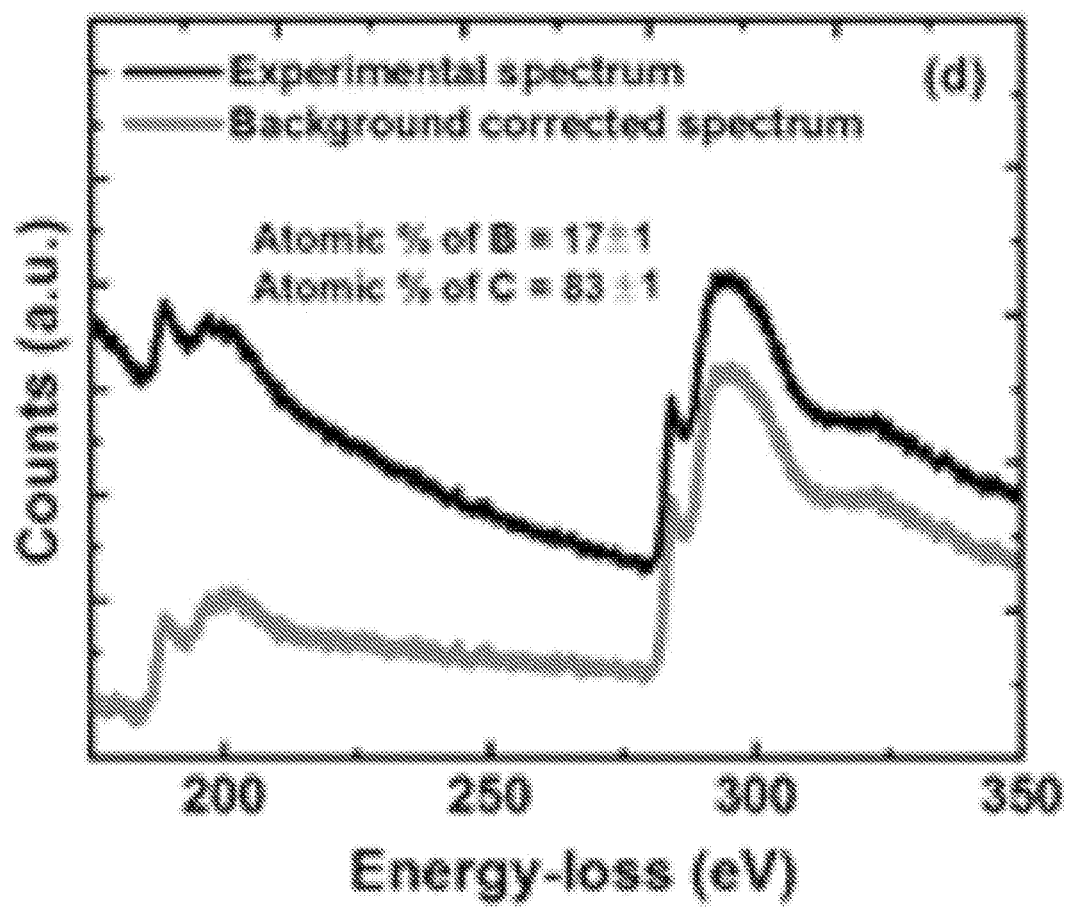
FIGS. 5D-F are each graphs depicting an example of a representative EELS spectrum according to some aspects.
Figure 5E:
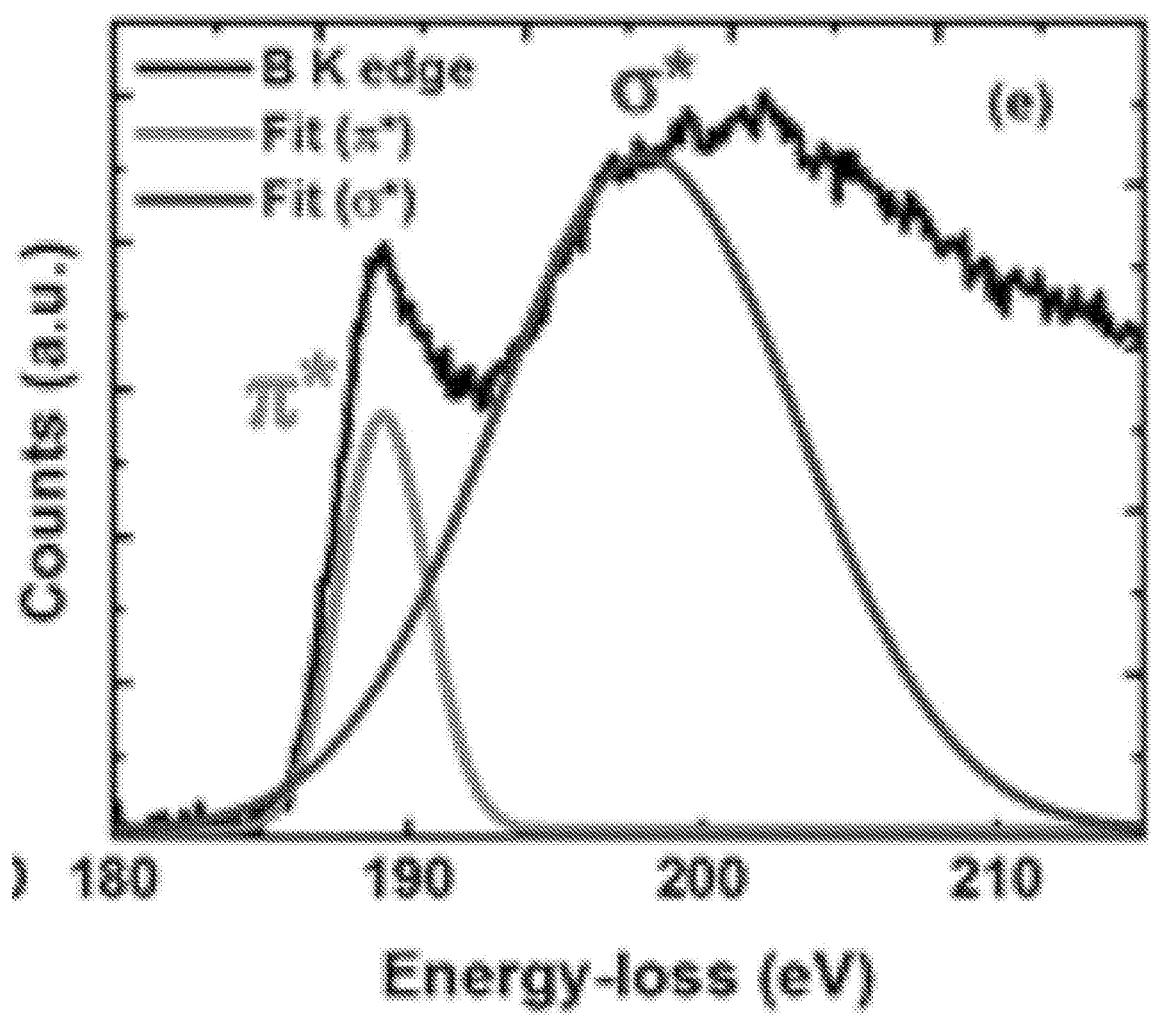
Figure 5F:
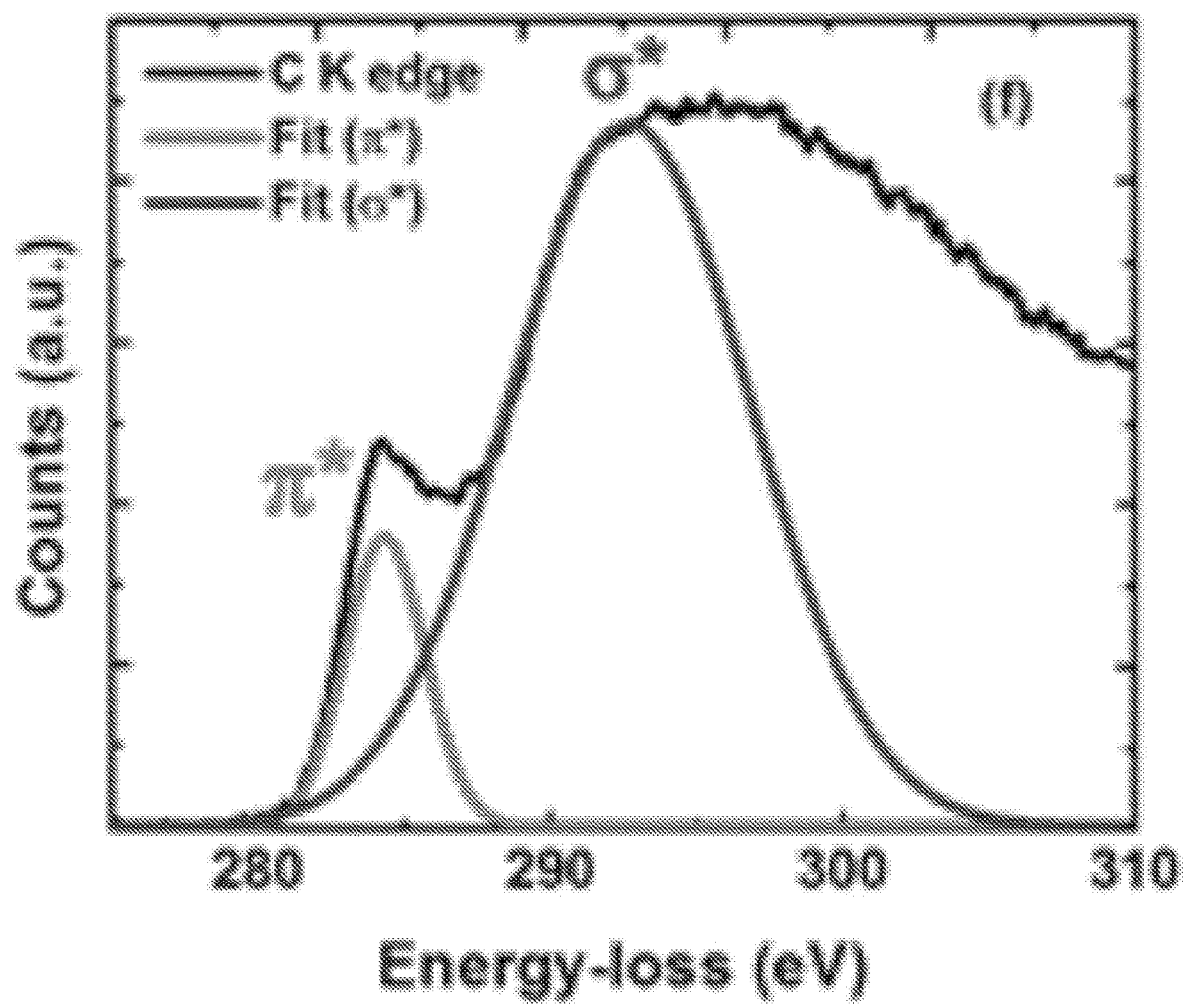

FIG. 5D depicts an example of a representative EELS spectrum, showing the K-edges of B and C according to some aspects. In the example depicted in FIG. 5D, the spectrum contains the characteristic $\pi^*$ and $\sigma^*$ peaks associated with K-edge of B and C, showing the presence of B and C bonded in both $sp^3$ and $sp^2$ hybridized state. In some examples, the EELS quantification can estimate the average B concentration to be 17.0±1.0 at % in the Q-carbon. In some examples, the HRTEM, HAADF and CBED results show Q-carbon structure to be amorphous, which is consistent with X-ray diffraction. EDS elemental mappings show that B is homogeneously distributed in the amorphous carbon. The HAADF image of B-doped Q-carbon can be collected and X-ray EDS elemental mapping of B, Al, and C, whose concentrations are consistent with EELS data, can be performed. The homogeneous dispersion of B atoms as a result of laser melting and quenching can be important for high-temperature superconductivity in B-doped Q-carbon thin films. No evidence for B clusters is found in the EDS maps, which can indicate that the melting of B and C layer occurs during pulsed laser melting. The calculated $sp^3$ fraction from C edges by EELS quantification is in agreement with the measured values by Raman spectroscopy. The sp fraction of B as calculated from the K-edge of B in EELS is 0.62. The B in its $sp^3$ electronic state resembles the substitutional B atom in the diamond lattice. On the other hand, the $sp^2$ B electronic states are the interstitial B states which act as shallow electron donors (free $\pi$ electrons) thereby perturbing the superconducting properties of B-doped Q-carbon. In some examples, there can be a correlation between the $sp^3$ fraction in B with $T_c$ and electron-phonon coupling parameter as discussed in further detail below.

FIG. 6A is a graph depicting an example of magnetic moment versus temperature plots of B-doped Q-carbon thin film according to some aspects. In some examples, the magnetization versus temperature plot in zero field cooled (ZFC) and field cooled (FC) conditions are performed at 60 Oe applied magnetic fields for Q-carbon doped with 17.0±1.0 at % boron and is shown in FIG. 6A. From these measurements, the $T_c$ for B-doped Q-carbon can be estimated to be 36.0±0.5 K. The $T_c$ for crystalline diamond doped prepared from B-doped Q-carbon using HFCVD was found to be 25.0±0.5 K. As depicted in this example, the value of magnetic moment increases as a function of the magnetic field. The bifurcation with the application of magnetic field occurs at $T_c$ (36.0±0.5 K). This can be a result of trapping of magnetic fluxes in a superconducting material below $T_c$ after the application of an external magnetic field. Results on B-doped Q-carbon and diamond follow the characteristics of superconductivity in bismuth, where $T_c$ for amorphous bismuth is 6.8 K, compared 53 mK for bismuth single crystal. This trend in bismuth can be correlated with enhanced electron-phonon coupling and higher density of states at the Fermi level in amorphous Bi compared to single-crystal Bi. There can be a difference in the magnetic moment between the ZFC and FC curves indicating the presence of large flux pinning forces in the material. This can lead to trapping of magnetic flux in the FC condition. The transition temperature is shifted to lower values after application of the magnetic field, indicating inhomogeneous superconductivity in the B-doped Q-carbon thin films.

FIG. 6B illustrates the magnetic moment versus applied magnetic field plots at different temperatures (below $T_c$) in B-doped Q-carbon thin film. This is also referred to as the "butterfly hysteresis" at different temperatures (below $T_c$). The value of $H_{c1}(T)$ and $H_{c2}(T)$ can be calculated from the hysteresis loops. The magnetic field value for the highest point in the negative magnetic moment ($4^{th}$ quadrant) in the hysteresis loop corresponds to $H_{c1}(T)$. The value of $H_{c2}(T)$ can be determined as the field from which M(H) deviated first from the background (X axis). The $H_{c2}(T)$ can be found to vary at a faster rate than predicted by the Werthamer-Helfand-Hohenberg (WHH) model. According to the WHH model, the value of $H_{c2}(0)$ can be calculated using equation (1):

$$H_{c2}(0) = -0.69(dH_{c2}/dT)T_c \quad (1)$$

where $dH_{c2}/dT$ denotes the slope at $T_c$. Solving this equation yields the value of $H_{c2}(0)$ as 6.94 T, which is also shown in FIG. 6C. FIG. 6C depicts upper critical field and lower critical field in B-doped Q-carbon thin films along with the WHH curve with the inset depicting deconvolution of the lower critical field to $H_{cl}^{o\ and\ } H_{cl}^{\pi}$ peaks in B-doped Q-carbon thin films. In B doped Q-carbon thin films, the value of $H_{c2}(0)$ as calculated from the intersection of the extrapolated trend curve with the Y axis is 5.40 T. The Ginzburg-Landau coherence length ($\varepsilon_L$) can be calculated using the equation (2):

$$\varepsilon_L = [\Phi_0/2\pi H_{c2}(0)]^{0.5} \quad (2)$$

Using the value of $H_{c2}(0)$ as 5.40 T, $\varepsilon_L$ is calculated as 79.34 Å. The value of penetration depth ($\lambda_d$) can also be calculated using the equation (3):

$$H_{c1}(0) = (\Phi_0/4\pi\lambda_d^2)\ln(\lambda_d/\varepsilon_L) \quad (3)$$

The value of $\lambda_d$ can be calculated as 82.80 Å. The Ginzburg-Landau parameter (k) is calculated to be 1.04 ($>½^{0.5}$) thereby showing that B doped Q-carbon is a type II superconductor. The zero-temperature energy gap ($\Delta(0)$) in B-doped Q-carbon is calculated as 5.52 meV using the equation: $\Delta(0) = 1.76\ k_B T_c$. The value of the exponent (n) is calculated using the power law (equation (4))

$$\frac{H_c(T)}{H_c(0)} = 1 - \left(\frac{T}{T_c}\right)^n \quad (4)$$

From the $H_{c2}(T)$ data fitting, the value of n is derived to be 2.11 for the case of $H_{c2}(T)$, which is consistent with the BCS formalism. There is a downward curvature near 0 K in the case of $H_{c1}(T)$, which can be explained by the increased contribution from $H_{cl}^{o}(T)$ as compared to $H_{cl}^{\pi}(T)$.

From the viewpoint of practical applications, the critical current density of a superconductor as a function of temperature and field can be important parameters. The critical current density ($J_c$) is calculated using the Bean's formula (equation (5)) and is shown in FIG. 6D:

$$J_c = \left[\frac{20\Delta M}{tw^2\left(l-\frac{w}{3}\right)}\right] \quad (5)$$

where $\Delta M$ is the difference in magnetization values (+M and −M) at a particular magnetic field, and t, w, and l are the thickness, width, and length of the sample.

The value of $J_c$ (0 Oe) at 2 K is calculated as 2.75E9 A/cm² which is quite large as compared to B-doped diamond. The large value of $J_c(0\ Oe)$ in B doped Q-carbon is due to its small dimension. A large value of $J_c$ (0 Oe) is also indicative of flux-melting in this material. The inset in FIG. 6D indicates a logarithmic plot of $J_c$ versus magnetic field. The dark dotted line indicates the value of $J_c$ (1 T) at 2, 6, 16 and 21 K. The value of $J_c$ (1 T) at 21 K is found to be 1.57E8 A/cm². As shown in FIG. 6D, there is a sharp decrease of $J_c$ with an increase in the magnetic field. There occurs a transition from the superconducting state to the normal state in a type-II superconductor above the upper critical field. The ability to transmit the critical current (with no heat loss) in a superconductor can cease much below the upper critical field. The corresponding magnetic field is termed as the irreversibility field (H*~2.5 T), whose value is approximately half to that of $H_{c2}$ (~5.4 T). Above H*, the Lorentz force which is created on the magnetic vortices causes depinning and thereby drastically reduces the critical current density. An increase in the value of H* is possible by introducing pinning centers in the matrix of a superconductor which in turn adversely affects the value of maximum critical current density. The high value of the $J_c$ (0 Oe) can also be predicted from the sharp fall in the magnetic moment at $T_c$ in the zero field cooled condition (FIG. 6A). The high critical current density of B-doped Q-carbon (at low magnetic fields) makes it an ideal candidate for low field NMR inserts.

In some examples the temperature dependence of the critical field (at 0 Oe) can be fitted with $J_c\ (T) = J_c\ (0) [1-(T/T_c)]$. The value of $J_c$ (0) is extracted as 2.53E9 A/cm². At 4.2 K the value of $J_c$ (0 Oe) is calculated as approximately $10^7$ A/mm² which is higher than found in Nb—Ti, Nb₃Sn and YBCO superconductors (<$10^5$ A/mm²). The high values of $J_c$ in B-doped Q-carbon can be due to the fact that the energy required to exclude the magnetic field is low in the case of B-doped Q-carbon (0.04×energy required for Nb₃Sn superconductors). A weaker dependence of $J_c$ at higher fields is also observed in B-doped Q-carbon. This can be due to the presence of a large number of weakly-coupled superconducting regions. The larger values of $J_c$ at lower temperatures can be due to the presence of pinned states. Q-carbon may also contain diamond and DLC inclusions due to inhomogeneous melting, which can enhance flux pinning. Therefore, larger current density is required to move the pinned vortices. At a larger magnetic field this phenomenon may be negligible due to the presence of an external magnetic field which assists the movement of the pinned states. In some examples, in a pure annealed superconductor, the values of Je may be low due to the presence of flux lattice lines (FLL), which dissipate the energy and the superconductor eventually turns "normal". The refinement of the superconducting grain size introduces pinning centers in a superconductor. This cause an increase in the value of $J_c$.

Figure 7:
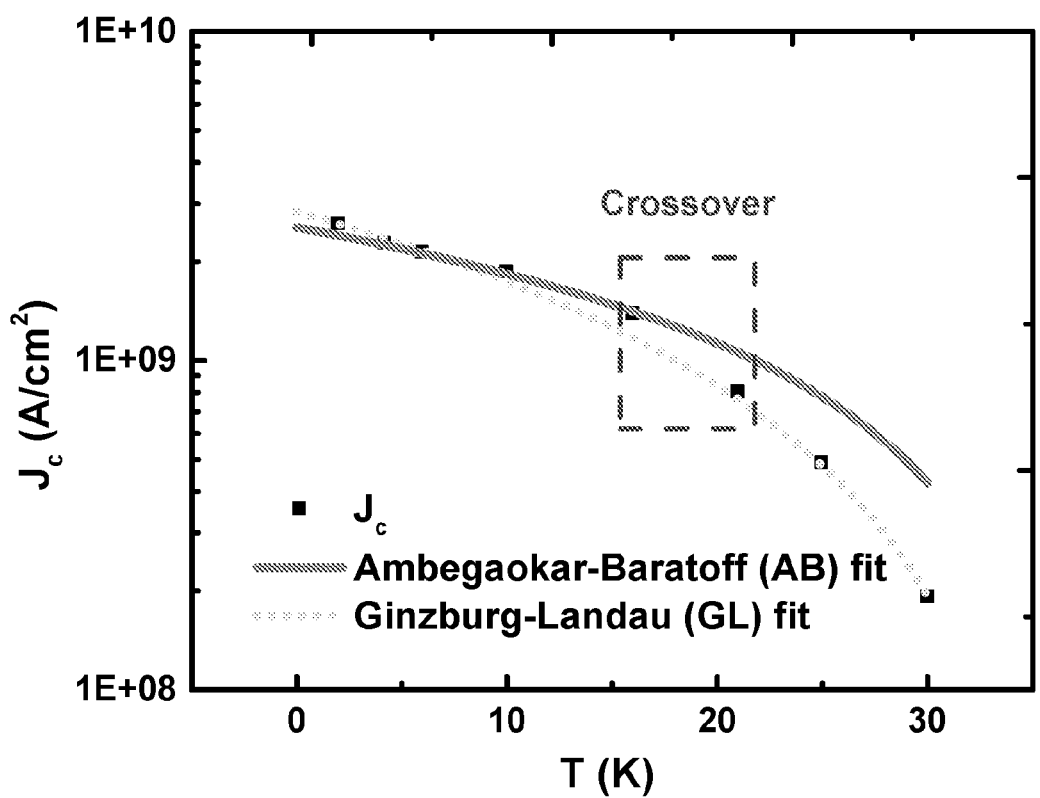
FIG. 7 depicts the temperature dependence of critical current density in B-doped Q-carbon according to some aspects.

FIG. 7 depicts the temperature dependence of critical current density in B-doped Q-carbon at 0 Oe. In some examples, $J_c$ decreases with an increase in temperature. In some examples, there can be a crossover from the Ambegaokar-Baratoff (AB) model to Ginzburg-Landau (GB) model at approximately 15 K in B-doped Q-carbon. According to the AB temperature dependence, the critical current density is proportional to $(1-T/T_c)$, whereas GL predicts as $(1-T/T_c)^{1.5}$. As shown in the example depicted in FIG. 7, the solid curve (AB) fits better (than the dotted curve) at lower temperatures (≤15 K) whereas at higher temperatures (>15 K) up to $T_c$ the dotted curve (GL) fits better (than the solid curve). The AB temperature dependence at low temperatures is due to the presence of weak Josephson coupling and is observed in granular superconductors. Above 15 K up to $T_c$, GL dependence is observed in B-doped Q-carbon due to the presence of current-induced gap suppression effect. In some examples, an increase in the coherence length can also increase the crossover temperature in high-temperature superconductors. The crossover point also indicates an equality of the Josephson coupling energy and the superconducting condensation energy, which is approximately 15 K in the case of B-doped Q-carbon. The ratio of Josephson coupling energy to the superconducting condensation energy ($\varepsilon_0$) can be calculated using the equation (6):

$$\varepsilon_0 = \frac{1}{0.882}\left(1 - \frac{T_x}{T_c}\right) \quad (6)$$

where $T_x$ denotes the crossover temperature. Using the value of $T_x$ as 15 K the dimensionless quantity $\varepsilon_0$ is calculated as 0.66. This can indicate a moderate Josephson-coupling in B-doped Q-carbon which causes the crossover between the AB and GL theory. The ratio $\varepsilon_0$ is also inversely proportional to the electronic density of states near the Fermi level (N(0)). The value of $\varepsilon_0$ is less than 1 thereby indicating an increase in the density of states near the Fermi level. This increase in N(0) may produce a moderate electron-phonon coupling in the B-doped Q-carbon structure. The current-induced gap suppression above ~15 K (in B-doped Q-carbon) indicates the formation of a core of radius $\varepsilon_L$ (T) in its vortex state. With a decrease in temperature, there occurs a shrinkage of the core which causes the crossover to the AB theory (critical current density versus temperature dependence). The depairing current density (j$_0$) in B-doped Q-carbon can be estimated as 1.65E10 A/cm$^2$ by using $j_0 = \phi_0/(3\sqrt{3}\pi\lambda^2\xi)$, where $\phi_0$, $\lambda$ and $\xi$ represent the flux quantum, penetration depth and coherence length, respectively. This can indicate that approximately 15% of the depairing current (at 0 Oe) in B-doped Q-carbon is achieved. A further enhancement in $J_c$ can occur by increasing the B concentration and pinning centers.

In some examples, the coherence length, $\varepsilon_L$ is calculated as 79 Å in B-doped Q-carbon samples. This coherence length can be compared to the size of the superconducting regions. So the reduced size of superconducting regions in B-doped Q-carbon can cause an increase in the value of $J_c$. The $T_c$ for phonon-mediated superconductivity can be calculated using the McMillan formula (equation (7)):

$$T_c = \frac{\langle\omega\rangle_{log}}{1.2}\exp\left(-\frac{1.04(1+\lambda)}{\lambda - \mu^*(1+0.62\lambda)}\right) \quad (7)$$

where, $\langle\omega\rangle_{log}$ is the logarithmic average of phonon frequencies, $\mu^*$ is the screened Coulomb pseudopotential, and $\lambda$ is the measure of average electron-phonon coupling. Using the value of $\langle\omega\rangle_{log}$, $\mu^*$ and $T_c$ as 67.4 meV, 0.1 and 36.4 K, respectively, the calculated value of $\lambda$ is 0.797, which is consistent with theoretical calculations of Moussa and Cohen for B-doped diamond. The value of $\lambda$ is indicative of moderate electron-phonon coupling in B doped Q-carbon. This can be explained by the relation between A, the density of states at the Fermi energy (N(0)), ionic mass (M), average square of electron-phonon matrix element ($<I^2>$), and the characteristic phonon frequency averaged over the phonon spectrum ($<\omega^2>$). The average electron-phonon coupling parameter is related to the above variables by the following equation (8):

$$\lambda = (N(0)<I^2>)/(M<\omega^2>) \quad (8)$$

Hall Effect measurements indicate a composite carrier concentration of approximately $10^{22}$ cm$^{-3}$ in B-doped Q-carbon samples. This indicates a substantial value of N(0) in these films. The atomic mass can also be low. But the moderate value of A in B doped Q-carbon can be due to the presence of strong covalent bonds (stronger than diamond) thereby dramatically increasing the value of $<\omega^2>$. In the B doped Q-carbon thin films, all the valence states are of a electronic states with stronger electron-phonon coupling as compared to B doped diamond. The presence of substitutional disorder can quench T in B doped diamond by opening a gap in the valence states. The value of T rises monotonically by increasing the B concentration (in the substitutional sites) in diamond. To date, the highest value of $T_c$ achieved in diamond-5% B thin film synthesized using PECVD technique is 11 K. At higher B concentrations, B doped diamond enters into the dirty type II superconductor regime where scattering of Bloch states by impurities does not play an important role. The substitutional disorder states are not formed during the ultrafast pulsed laser annealing of Q-carbon. This gives rise to high $T_c$ in B doped Q-carbon structure. The substitutional B in B doped Q-carbon can act as shallow acceptor in the valence band. This gives rise to the formation of holes which strongly couple with phonons thereby giving rise to high $T_c$ superconductivity. In some instances there exists highly inhomogeneous nature of electron-phonon coupling in the disordered matrix.

In some examples, in the highly disordered B doped Q-carbon structures, high value of $T_c$ may also result from the magnetic flux percolation through regions possessing above average electron-phonon coupling value. Due to the presence of a and n electronic states in B-doped Q-carbon, there can exist two distinct superconducting gaps. The first gap can be created due to the presence of in-plane a bonding and the other one due to out-of-plane n bonding. The bonding orbitals associated with these electronic states are weakly coupled thereby giving rise to interband coupling in these materials. In some examples, this coupling strength can be reduced by selective alloying a superconductor with non-magnetic elements. This is reflected by an increase in the value of $H_{c2}$. In some instances, the critical magnetic fields can be analyzed according to a theoretical model. In this model, the σ and π electronic states are separated by a Josephson contact (interband coupling). At lower temperatures the contribution from the π electronic states can be predominant and this gives rise to an upward curvature in the doped thin films (having a significant π fraction). This can be explained by an increased electronic scattering in the in band of the doped superconductor. As shown in the inset of FIG. 6C, the $H_{c1}$ follows a downward curvature at lower temperatures. This is indicative of predominant a band contribution as compared to π band scattering. This is also consistent from the $H_{c2}$ plot. B-doped Q-carbon thin films have a superconducting property due to the presence of shallow acceptor electronic states associated with B. Deconvolution of the Hi curve gives rise to two peaks centered at 3.18 K and 16.41 K belonging to $H_{c1}^\sigma$ and $H_{c1}^\pi$, respectively. The $H_{c1}^\sigma$ fraction calculated from the fitting program is 0.63. This is in agreement with the B a electronic state fraction (0.62) calculated from the B K edge in EELS. The quantification routine in the EELS spectra takes into account of the electronic density of states which cause critical magnetic field in magnetic materials. Some embodiments described herein involve detailed theoretical modeling of the superconductivity in B doped Q-carbon and diamond.

In some examples, in amorphous B-doped Q-carbon where B doping exceeds the retrograde solubility limits (2.0 at % in diamond), a massive number of carriers in the form of positive holes are formed. In some examples, massive number of carriers create strong interaction with the hard phonons. Density functional theory (DFT) calculations indicate that at lower B concentrations (less than 5 at %), there occurs phonon mediated hole scattering to high energy optical phonon modes, thereby causing superconductivity in B-doped diamond. Acoustic modes provide a negligible contribution to superconductivity. The phonon states of B atoms play a vital role in the coupling to optical modes. Increased B concentration (in the substitutional sites) therefore causes an increase in the electron-phonon coupling strength leading to an increase in the $T_c$.

In some examples, the density of electronic states near the Fermi energy level can be predominantly characterized by the electronic states in substitutional B atom. Therefore, it can be assessed that an increase in $T_c$ is directly related to an increase in the electronic density of states near the Fermi level. In some instances, in the superhard material, BCs with 16.67 at % of B, the electronic density of states near the Fermi energy level is 2.1 times higher than that in 2% B-doped diamond. In some examples, this provides evidence of an increase in the number of charge carriers induced by B doping. From the phonon density of states and energy calculations in BCs, it has been found that higher energy modes (115-160 meV) correspond to C—C vibrations, whereas the lower energy modes (<100 meV) are due to vibrations pertaining to B and its neighboring C atoms. There can also be evidence that an increase in the intensity of the phonon density of states corresponds to lower energy with an increase in B doping. This may be due to better coupling of low energy modes in highly doped samples. Therefore, superconductivity in B-doped carbon samples can be attributed to vibrations associated with B atoms and its neighboring electronic concentration. In some examples, in the superhard materials described herein, with large values of elastic constant and strong chemical bonds, there are high-energy phonons and increased electronic charge densities. These properties can cause superconductivity in the superhard materials if they possess moderate to large electron-phonon coupling constants.

Figure 8A:
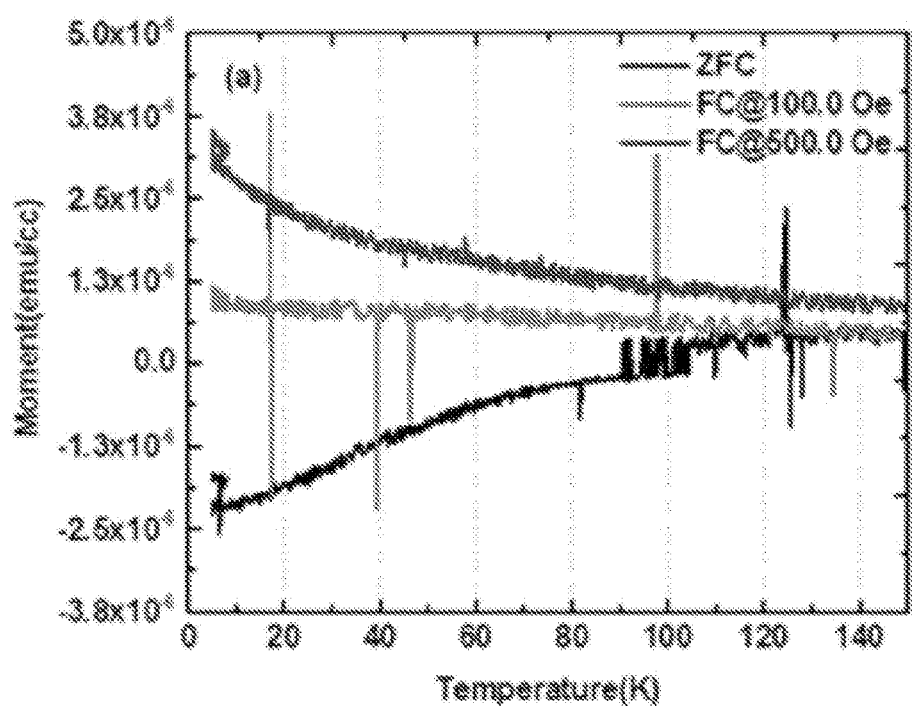
FIG. 8A shows the magnetic moment versus temperature plots of c-sapphire substrate according to some aspects.
Figure 8B:
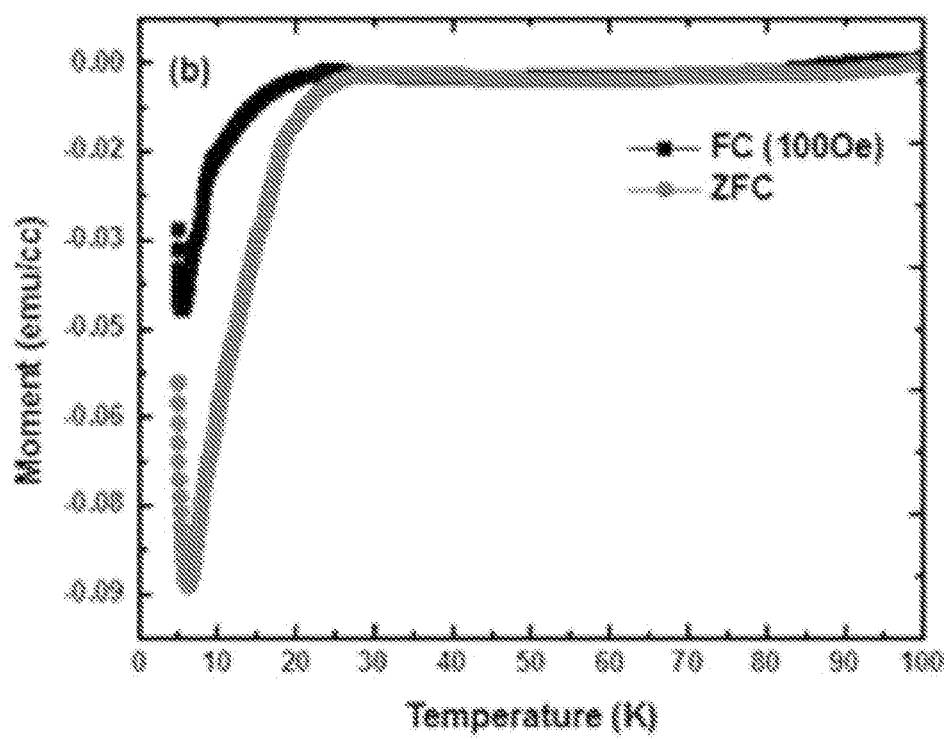
FIG. 8B shows temperature-dependent magnetic moment curves of crystalline diamond doped with 17.0±1.0 at % boron according to some aspects.
Figure 8C:
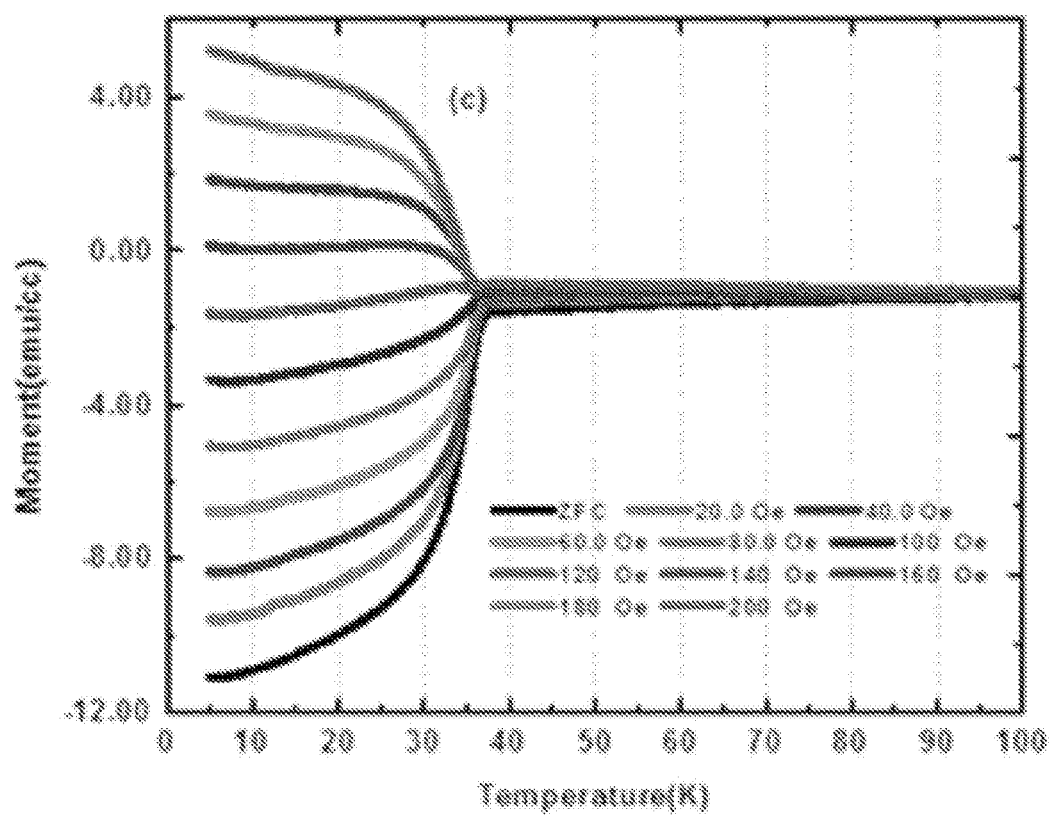
FIG. 8C shows temperature-dependent magnetic moment plots at various applied magnetic fields in B-doped Q-carbon thin films according to some aspects.

FIG. 8A shows the magnetic moment versus temperature plots of c-sapphire substrate according to some aspects. Zero-field-cooled (ZFC) and field-cooled (FC) curves indicate the pristine nature of the substrate. The background substrate corrections were done by using the magnetic plots of the substrate under identical conditions. FIG. 8B shows temperature-dependent magnetic moment curves of crystalline diamond doped with 17.0±1.0 at % boron according to some aspects. In the example depicted in FIG. 8B, B-doped diamonds are HFCVD grown using B-doped Q-carbon as the template. The ZFC and FC (at 100 Oe) curves indicate a transition temperature ($T_c$) of 25.0±0.5 K in the B-doped diamond samples. This transition temperature is higher than the previously experimentally reported value of $T_c$ in B-doped diamond. FIG. 8C shows temperature-dependent magnetic moment plots at various applied magnetic fields in B-doped Q-carbon thin films according to some aspects. As shown in the example depicted in FIG. 8C, the value of magnetic moment increases as a function of the magnetic field. The bifurcation with the application of magnetic field occurs at $T_c$ (36.0±0.5 K). This can occur as result of trapping of magnetic fluxes in a superconducting material below $T_c$ after the application of an external magnetic field.

Figure 9A:
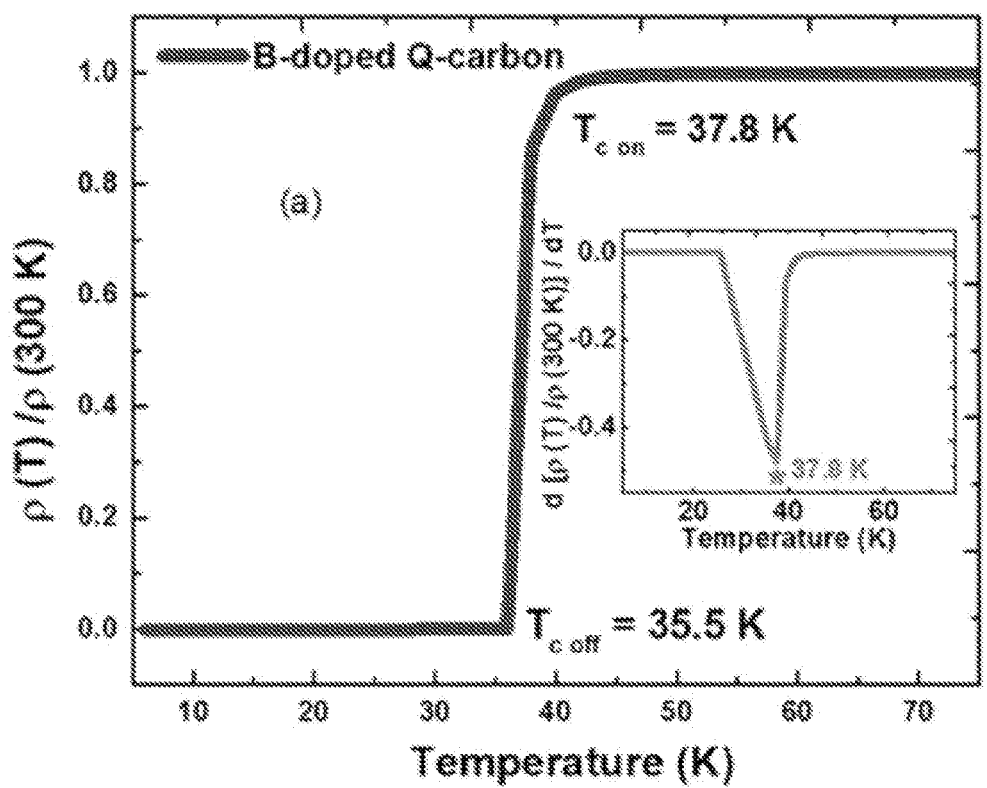
FIG. 9A shows the temperature-dependent (normalized) resistivity measurements of B-doped Q-carbon thin films according to some aspects.
Figure 9B:
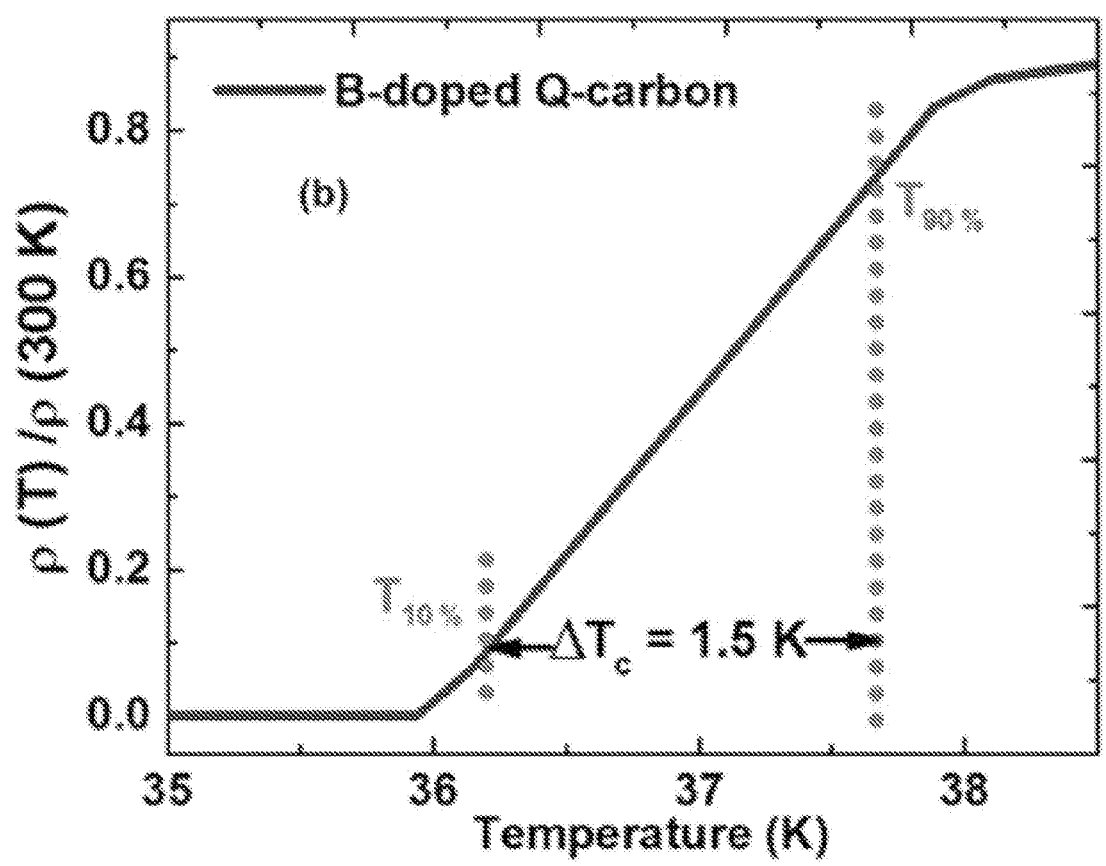
FIG. 9B shows the enlarged view of the superconducting transition of B-doped Q-carbon according to some aspects.

FIG. 9A shows the temperature-dependent (normalized) resistivity measurements of B-doped Q-carbon thin films according to some aspects. FIG. 9A shows the onset of superconducting transition below ~38 K. The zero-resistivity ($T_{c\_off}$) condition is observed at 35.5 K. The sharper superconducting transition in B-doped Q-carbon indicates the presence of a high-quality superconducting phase. The inset in FIG. 9A shows the temperature derivative plot to depict the maximum resistivity drop at 37.8 K (shown by *). FIG. 9B shows the enlarged view of the superconducting transition of B-doped Q-carbon according to some aspects. The transition width ($\Delta T$) is calculated to be 1.5 K. This transition width is comparable to that of high-temperature oxide superconductors, but wider than observed in single-crystal metallic superconductors (~$10^4$ K). The transition width in a zero magnetic field condition can also be dependent on the crystalline nature of a sample, with the single-crystal sample having a more narrow transition than their polycrystalline counterparts. An increase in the transition width in B-doped Q-carbon demonstrates its amorphous nature. The conditions of field and temperature necessary for the establishment of superconductivity in an amorphous sample will vary from one region of the sample to another in correspondence with the local value of the mean free path. This may also lead to magnetic field percolation through the regions of large electron-phonon coupling, thereby causing high-temperature superconductivity in B-doped Q-carbon.

Figure 10A:
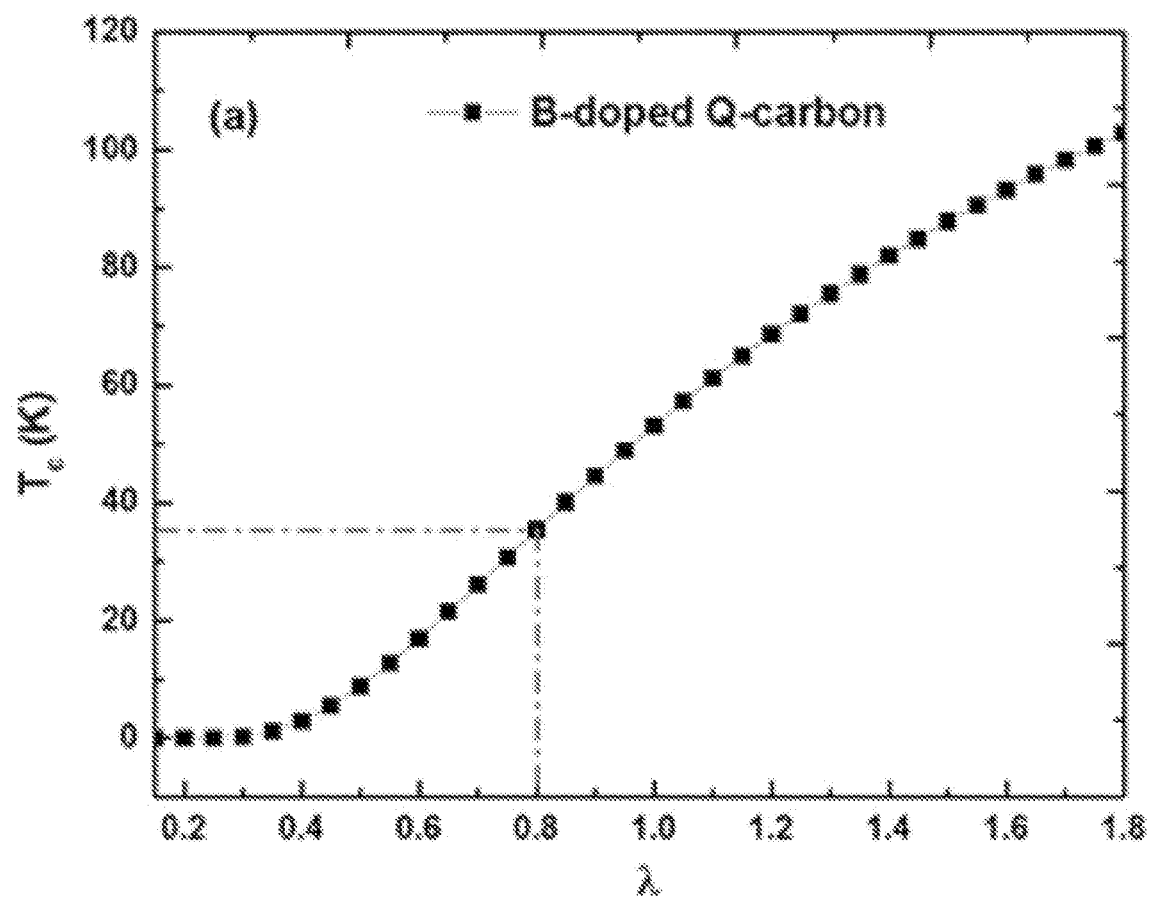
FIG. 10A depicts the variation of electron-phonon coupling parameter with $T_c$ in B-doped Q-carbon using the McMillan equation according to some aspects.

FIG. 10A depicts the variation of electron-phonon coupling parameter with $T_c$ in B-doped Q-carbon using the McMillan equation. As shown in the example depicted in FIG. 10 (a), the $T_c$ dependence on the electron-phonon coupling parameter is not strong at low values of $\lambda$(<0.40). When the values of $\lambda$ are in the moderate-coupling regime (greater than 0.45), $T_c$ increases rapidly. This is a characteristic feature of a superconducting material and it is due to the exponential relation between $T_c$ and $\lambda$. A value of electron-phonon coupling of 0.2 is calculated in 2.0 at % B-doped diamond which has $T_c$ of 4 K. The value of the electron-phonon coupling in B-doped amorphous Q-carbon is calculated as approximately 4 times as that in B-doped diamond. This can indicate stronger electron-phonon coupling in B-doped Q-carbon as compared to B-doped crystalline diamond, thereby leading to high-temperature superconductivity in B-doped Q-carbon. The EELS quantification in B-doped Q-carbon provides a valuable insight into the origin of superconductivity in the materials described herein and prepared by ultrafast melting and subsequent quenching process.

Figure 10B:
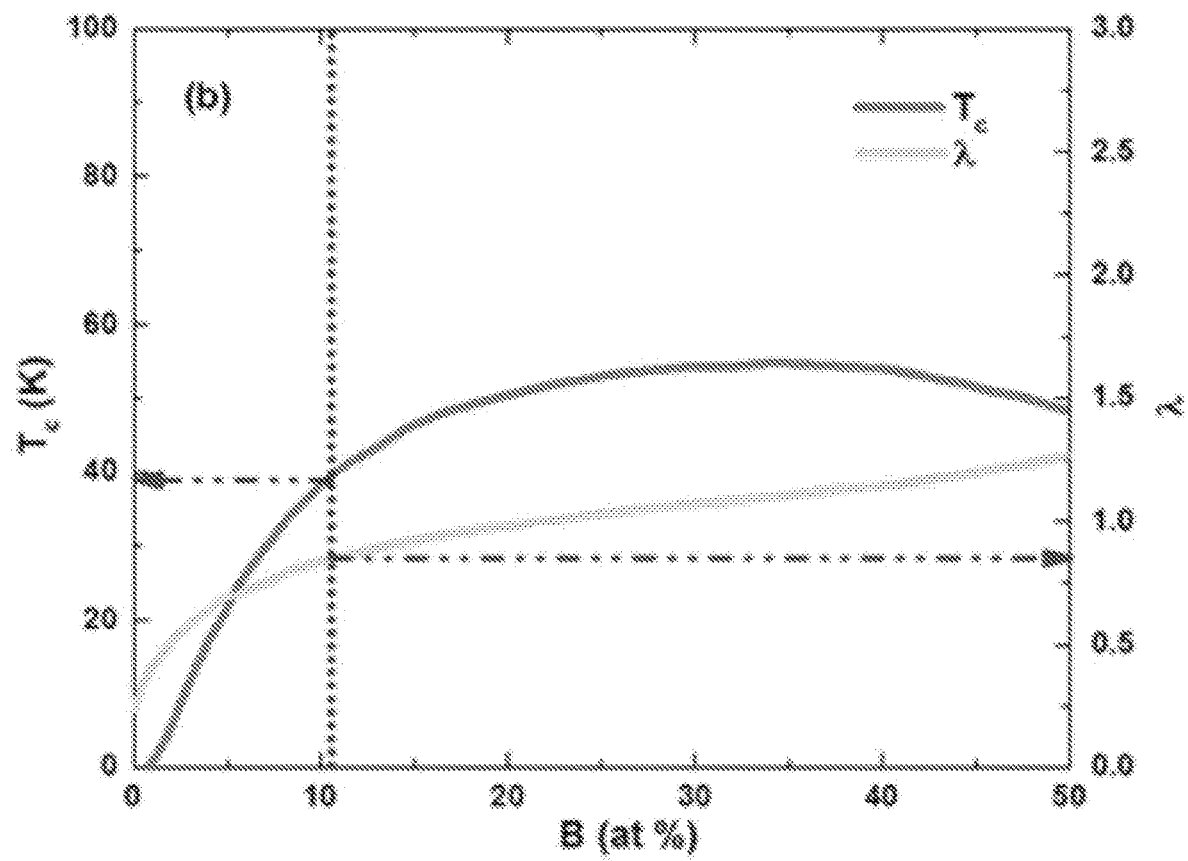
FIG. 10B depicts the density functional theory (DFT) calculation of electron-phonon coupling and $T_c$ in B-doped diamond and their dependence on B at % according to some aspects.

In some examples, electronic states corresponding to the σ bonding are present in both C and B in B-doped Q-carbon. After using the EELS quantification routine, the σ fractions calculated for C and B are 0.83 and 0.62, respectively. As described above, the B at % present in B-doped Q-carbon is 17.0±1.0%. Therefore, the fraction of B contributing to the $sp^3$ bonding (a electronic state) is 0.10 (10.54 at %). In some examples, the B electrons present in the a electronic states can play an important role in the superconductivity in B-doped Q-carbon. These electronic states act as shallow acceptor and are situated close to the Fermi level. When B-doped Q-carbon is cooled below approximately 36 K, hole Cooper pairs are formed. These Cooper pairs are mediated by the phonons and cause high-temperature superconductivity in B-doped diamond. On the other hand, B atoms present in the π electronic states have delocalized electrons (donor states) and can thwart the formation of hole Cooper pairs. This can lead to a reduction in $T_c$ in B-doped Q-carbon. FIG. 10B depicts the density functional theory (DFT) calculation of electron-phonon coupling and $T_c$ in B-doped diamond and their dependence on B at %. In these calculations, the substitutional disorder arising from the B doping is not considered. In other words, these calculations pertain to B-doped a electronic states only. As shown by the plots in FIG. 10B, a 10.5 at % of B sample (doped in the sp³ hybridized electronic sites) gives rise to a value of 0.8 for the electron-phonon coupling parameter. This translates to a $T_c$ value of approximately 38 K. In some embodiments, 10.54 at % B-doped in the sp³ electronic sites of Q-carbon results in a $T_c$ value of 36.00.5 K and λ as 0.797. This is in agreement with the DFT calculated values in B-doped diamond (without considering substitutional disorder). Thus the high-temperature superconductivity in B-doped Q-carbon is due to the B doping in the sp³ electronic sites of Q-carbon. The sp² electronic sites present in Q-carbon prevent the formation of B dimers and metallic precipitates which can reduce $T_c$. The substitutional disorder in B-doped amorphous Q-carbon is minimized, which leads to higher $T_c$ than crystalline diamond.

Some embodiments described herein involve calculation of the threshold energy, as it will determine the minimum laser energy required for melting amorphous carbon/B thereby leading to the formation of B-doped Q-carbon structures. In some examples, SLIM (solid laser interaction in materials) programming can be employed to simulate the laser-solid interactions. These calculations can involve an accurate finite difference method to calculate the melt depth and temperature profile in the laser annealed samples. The initial layered structure consists of amorphous carbon/B/sapphire. The threshold energy ($E_{th}$) required for melting few layers of amorphous carbon/B thin film can be calculated using the equation (9):

$$E_{th} = \frac{K_s T_m \zeta^{0.5}}{(1-R_l)D^{0.5}} \quad (9)$$

where $K_s$ is thermal conductivity of amorphous carbon (=0.129 W cm⁻¹K⁻¹), $T_m$ is the difference between the substrate temperature of c-sapphire and melting temperature of amorphous carbon (=3523 K). In the equation above, ξ is pulsed laser width (=25 ns), $R_l$ is reflectivity of the amorphous carbon at 193 nm (=0.120), and D is the diffusivity of amorphous carbon at room temperature (=2 cm² sec⁻¹).

In some examples, the thickness of the melted region varies linearly with the pulse energy density. The surface starts to melt slowly due to the sudden change in reflectivity during the phase transition. As the laser pulse terminates, the melt front recedes back to the surface. The initial stages of solidification see a low velocity but quickly reach the maximum when the steady state condition is achieved. With the increase in pulse duration the onset of melting decreases with a decrease in solidification velocity. The maximum depth of melt also decreases with the increase in pulse duration. There is an increase in the time of peak melt depth with increasing laser pulse width.

The maximum melt depth ($\Delta x$) is calculated by equation (10):

$$\Delta x = C_1(E-E_{th}) \quad (10)$$

where, $$C_1 = (1-R_l)/(C_v T_m + L) \quad (11)$$

In equation (11), $C_v$ is the volume heat capacity of amorphous carbon at its melting point (=2.13 J cm⁻³ K⁻¹), and L is latent heat of fusion of amorphous carbon (=19775 J cm⁻³).

The melt in velocity ($v_{in}$) is calculated using equation (12):

$$v_{in} = \Delta T K_1 / L \Delta x \quad (12)$$

where, $\Delta T$ is the temperature difference between maximum temperature and melting point of amorphous carbon.

Again, $\Delta T$ is calculated using the equation (13):

$$\Delta T = \frac{L C_1^2}{K_l \zeta}(E-E_{th})^2 \quad (13)$$

In some examples, it can be calculated that the melt depth increases with the increase in substrate temperature. In the above-mentioned calculations the substrate temperature can be considered as 300 K. The relatively low plasma frequency of amorphous carbon can help for better material-laser coupling when 193 nm excimer laser is used. With the incidence of laser densities having energies more than the melting point of carbon, melting occurs of the carbon/B layers. This homogeneous metallic melt triggers the liquid phase diffusion process, where the dopant concentrations exceed the retrograde thermodynamic solubility limits. As it is shown from the temperature profile in the FIG. 10, the onset of melting occurs at approximately 20 ns after the laser is incident on the layered structure. The dotted line denotes the melting point of C. The melting point of B is approximately 2349 K. As shown from the temperature profile in FIGS. 10, B and C form a homogeneous melt when laser energy densities greater than 0.6 J/cm² are employed for the PLA process. A flatter temperature profile with time is essential for a better formation of a homogeneous melt.

Figure 11:
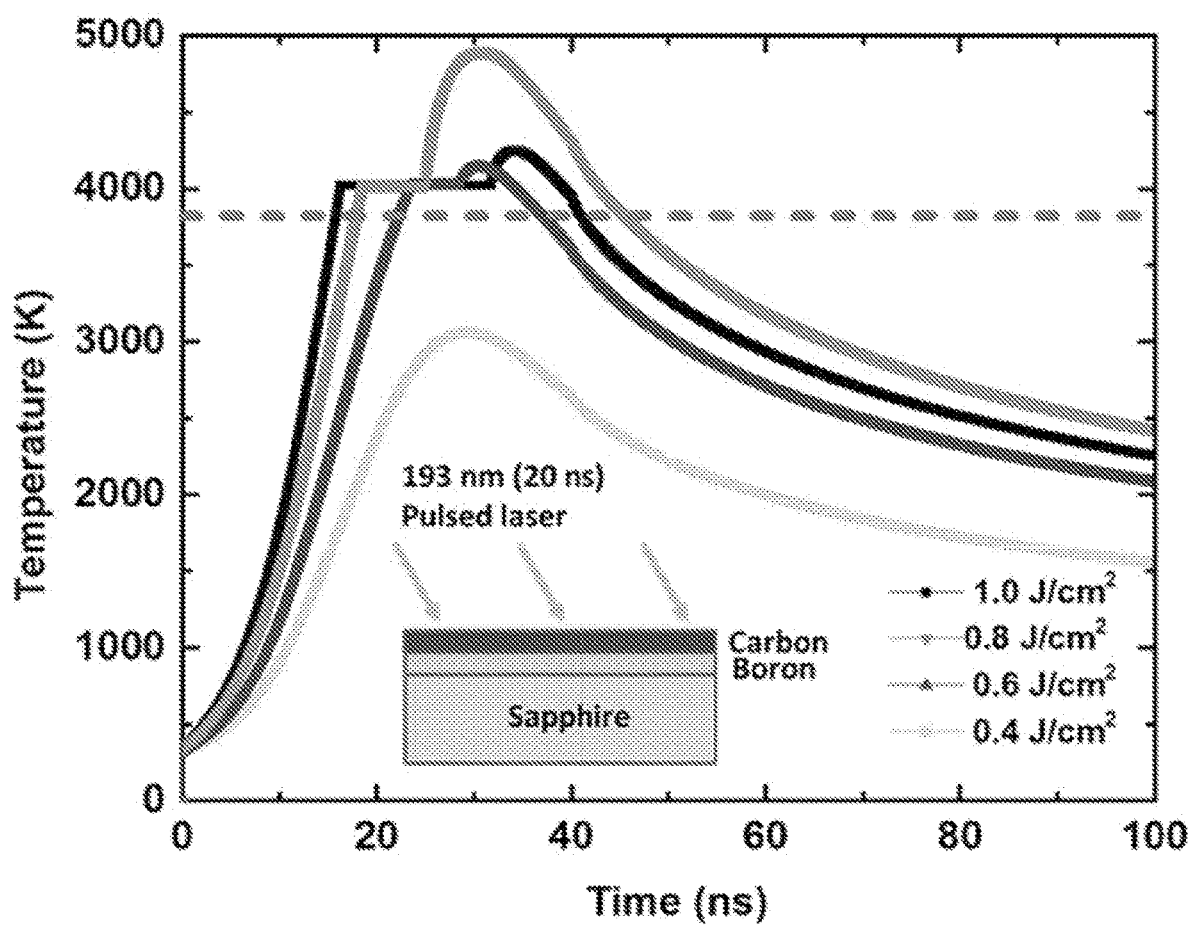
FIG. 11 depicts a temperature versus time profile after pulsed laser annealing (PLA) using different laser energy densities and simulated using solid laser interaction in materials (SLIM) programmming according to some aspects.

FIG. 11 depicts a temperature versus time profile after PLA using different laser energy densities and simulated using SLIM programmming. In the example depicted in FIG. 11, the dotted line corresponds to the melting point of carbon. The inset in the example depicted in FIG. 11, the dotted red line corresponds to the melting point of carbon. The inset represents a schematic diagram of the initial arrangement of C and B layers and the nanosecond laser used for a simulation application or program. In this example, a melt depth of approximately 500 nm with solidification velocities of 10-40 m/sec can be calculated using the simulation application or program.

As seen in the exampled depicted in FIG. 11, there is a large overshoot of temperature when laser energy density of 0.8 J/cm² is used, and this annealing condition should be avoided. Insufficient laser energy densities (lower than 0.4 J/cm²) do not cause melting of carbon and thus are not effective in the PLA technique. The homogeneous melt cools down with high solidification velocities (e.g., 10-40 m/sec). This causes sufficient undercooling to form B-doped amorphous Q-carbon. It should be noted that large and small undercooling causes formation of Q-carbon and diamond, respectively.

In some examples, mechanism of annealing can depend on laser and substrate parameters. Redistribution of dopants by laser annealing cannot be explained by diffusion in solid, as the diffusion time is ultrafast in nature. The diffusion coefficients in liquid counterparts are much higher than its solid phase and cause shallow and sharp dopant profile after laser annealing. In some examples, it has been seen that there are significant modifications taking place in the implanted region of Si lattice as a result of laser annealing. There occurs a substitution of the dopant atoms in Si lattice sites. Ion backscattering and ion channeling techniques can be used to determine this lattice substitution in crystalline solids. The lattice contraction (after substitution of lower atomic radii elements) and expansion can be measured by X-ray diffraction and ion channeling techniques. The lattice can expand or contract 1D in out of plane conditions. High dopant concentrations can also cause a measurable strain in the substrate lattice. In some instances, the time associated with laser annealing is small, less than a microsecond (critical time for dislocation nucleation), to cause the formation of misfit dislocations which tend to relieve the strain and destroy the one-dimensional change of lattice parameter. In some instances, there occurs the formation of B-doped amorphous Q-carbon after the PLA process, which involves melting and subsequent quenching from the super undercooled state. During the melting, B and C diffuse rapidly into liquid with diffusivity of approximately $10^{-4}$ cm$^2$/sec, and produce homogeneous molten state. Upon quenching of the super undercooled state, this B-doped Q-carbon phase is created with B concentrations exceeding thermodynamic solubility limits via solute trapping. This gives rise to the formation of shallow acceptor electronic states and moderate electron-phonon coupling in B-doped Q-carbon which causes the high-temperature superconductivity in this material.

In some examples, a type II superconductivity in B-doped Q-carbon with a $T_c$ of 36.0±0.5 K and upper critical field of 5.4 T at 0 K can be formed. This phase can be formed as a result of nanosecond laser melting of boron and carbon layers in a super undercooled state and rapid quenching subsequently. This process of rapid nanosecond melting and quenching can been modeled to obtain detailed temperature distribution, melting and quenching kinetics. This process can enhance the dopant concentrations beyond the thermodynamic solubility limits, via solute trapping, which can be incorporated into substitutional sites without affecting their energy levels and ionization efficiencies. The dopants can be substituted in the electrically active sites thereby giving rise to various advantageous magnetic and electrical properties. In some examples, it can be observed, both experimentally (TOF-SIMS, HAADF, and EELS) and theoretically (SLIM programming), that the melting of C and B layers occurs during the PLA technique. The liquid phase diffusivity of B in C causes an increase in the atomic concentration of B in C beyond the retrograde solubility limits to 17.0±1.0 at % in Q-carbon as compared to the thermodynamic solubility limit of 2.0 at % in diamond. This increase in B at % in B-doped Q-carbon can play an important role in high-temperature superconductivity.

In some instances, in B-doped Q-carbon, the upper critical magnetic field $H_{c2}(T)$ follows $H_{c2}(0)\,[1-(T/T_c)^{2.11}]$ temperature dependence and is consistent with the BCS formalism. The moderate electron-phonon values of 0.797 and high electronic density of states near the Fermi energy level result in high-temperature superconductivity in B-doped Q-carbon. EELS and Raman spectroscopy of B-doped Q-carbon illustrate the structure, bonding, and sp$^3$ fraction in materials of the present disclosure, which ultimately leads to high-temperature superconductivity. The EELS quantification of the sp$^3$ fraction in B reveals that 10.54 at % of B is doped in the sp$^3$ electronic states of Q-carbon. According to the DFT calculations in B-doped diamond (without considering the substitutional disorder electronic states), $T_c$ and $\lambda$ values are calculated as approximately 37 K and 0.8, respectively. This is in agreement with the corresponding values measured in B-doped Q-carbon, where the substitutional disorder is minimized as a result of amorphous structure. In some instances, this can indicate that the high-temperature superconductivity in B-doped Q-carbon is due to the B doping in the sp$^3$ electronic sites of Q-carbon. The electronic Raman spectra of B-doped Q-carbon reveal an acceptor energy level at ~33 meV with the spin-orbit splitting energy value of ~7 meV. This energy state corresponds to ~37 meV and ~6 meV (spin-orbital splitting) found in the B-doped diamond. The presence of this electronic state near the valence band maximum indicates an increase in the density of shallow acceptor electronic states near the Fermi energy level. Therefore, the moderate electron-phonon values and high electronic density of states near the Fermi energy level result in high-temperature superconductivity in B-doped Q-carbon.

In some examples, the EELS quantification estimates the average 17.0±1.0 at % B in the B-doped Q-carbon, which is crucial for the high-temperature $T_c$ in this material. The critical current density dependence with temperature and field in B-doped Q-carbon indicate that materials of the present disclosure can be used for MRI and NMR applications. The critical current densities with field show considerably large values (4.3×10$^7$ Acm$^{-2}$ at 21 K and 2 T) than typical oxide superconductors (BSCCO: 1.2×10 Acm$^{-2}$ at 4.2 K), which can be an important consideration for practical applications. In some examples, signatures of $T_c$>55 K can be obtained, and still higher $T_c$ over 100 K and higher can be obtained with higher B-concentration in Q-carbon. Embodiments of high-temperature superconductivity in B-doped Q-carbon as described herein can be beneficial for various applications, including, for example, developing strongly-bonded carbon-based materials having near room temperature superconductivity.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude the inclusion of such modifications, variations, and/or additions to the present subject matter as would be readily apparent to one of ordinary skill in the art.

What is claimed is:

1. A method comprising:
    depositing a first layer of boron and a second layer of un-doped amorphous carbon on a substrate, wherein the un-doped amorphous carbon is diamagnetic;
    melting the first layer of boron and the second layer of un-doped amorphous carbon by a laser pulse to form a melted boron-doped amorphous carbon; and
    quenching the melted boron-doped amorphous carbon to create a quenched boron-doped amorphous carbon that is diamagnetic and superconducting, wherein the quenched melted boron-doped amorphous carbon comprises a mixture of sp3 bonded carbon atoms and sp2 bonded carbon atoms and a superconducting transition temperature ($T_c$) of the quenched boron-doped amorphous carbon increases based on a boron concentration and is higher than a superconducting transition temperature of diamond.

2. The method of claim 1, wherein depositing the first layer of boron and the second layer of un-doped amorphous carbon on the substrate comprises:

depositing the first layer of boron or the second layer of un-doped amorphous carbon on the substrate to a thickness between approximately 100 nanometers (nm) and 500 nm at a temperature between approximately 30 degrees Celsius and 300 degrees Celsius and between approximately 1.0E minus 6 torr operating pressure.

3. The method of claim 1, wherein the superconducting transition temperature of the quenched boron-doped amorphous carbon is at least 35 K and the quenched boron-doped amorphous carbon has an upper critical field of approximately 5.4 T at 0 K.

4. The method of claim 1, wherein the superconducting transition temperature of the quenched boron-doped amorphous carbon is between 35.5 K and 36.5 K.

5. The method of claim 1, wherein the superconducting transition temperature of the quenched boron-doped amorphous carbon is between 37 K and 55 K.

6. The method of claim 1, wherein the superconducting transition temperature of the quenched boron-doped amorphous carbon is at least 55 K.

7. The method of claim 1, wherein the superconducting transition temperature of the quenched boron-doped amorphous carbon is up to 37 K and the quenched boron-doped amorphous carbon comprises approximately seventeen atomic percent boron atoms.

8. The method of claim 1, wherein the superconducting transition temperature of the quenched boron-doped amorphous carbon is up to 55 K and the quenched boron-doped amorphous carbon comprises approximately twenty five atomic percent boron atoms.

9. The method of claim 1, wherein the superconducting transition temperature of the quenched boron-doped amorphous carbon is above 100K and the quenched boron-doped amorphous carbon comprises approximately fifty atomic percent boron atoms.

10. The method of claim 1, wherein the quenched un-doped amorphous carbon shows ambient temperature ferromagnetism with a Curie temperature above 500 K.

11. The method of claim 1, wherein the substrate comprises sapphire.

12. A product formed by the method of claim 1.

13. A method comprising:
depositing a first layer of boron and a second layer of un-doped amorphous carbon on a substrate by:
depositing the first layer of boron or the second layer of un-doped amorphous carbon on the substrate to a thickness between approximately 100 nanometers (nm) and 500 nm;
melting the first layer of boron and the second layer of un-doped amorphous carbon by a laser pulse to form a melted boron-doped amorphous carbon; and
quenching the melted boron-doped amorphous carbon to create a quenched boron-doped amorphous carbon that is diamagnetic and superconducting, wherein the quenched melted boron-doped amorphous carbon comprises a mixture of sp3 bonded carbon atoms and sp2 bonded carbon atoms and wherein a superconducting transition temperature ($T_c$) of the quenched boron-doped amorphous carbon increases based on a boron concentration and is higher than a superconducting transition temperature of diamond.

14. The method of claim 13, wherein depositing the first layer of boron and the second layer of amorphous carbon on the substrate further comprises:
depositing the first layer of boron or the second layer of un-doped amorphous carbon on the substrate at a temperature between approximately 30 degrees Celsius and 300 degrees Celsius and between approximately 1.0E minus 6 torr operating pressure.

15. The method of claim 13, wherein the superconducting transition temperature of the quenched boron-doped amorphous carbon is at least 35 K and the quenched boron-doped amorphous carbon has an upper critical field of approximately 5.4 T at 0 K.

16. The method of claim 13, wherein the superconducting transition temperature of the quenched boron-doped amorphous carbon is between 35.5 K and 36.5 K.

17. The method of claim 13, wherein the superconducting transition temperature of the quenched boron-doped amorphous carbon is between 37 K and 55 K.

18. The method of claim 13, wherein the superconducting transition temperature of the quenched boron-doped amorphous carbon is at least 55 K.

19. The method of claim 13, wherein the superconducting transition temperature of the quenched boron-doped amorphous carbon is: i) up to 37 K when the quenched boron-doped amorphous carbon comprises approximately seventeen atomic percent boron atoms; ii) up to 55 K when the quenched boron-doped amorphous carbon comprises approximately twenty five atomic percent boron atoms; or iii) above 100K when the quenched boron-doped amorphous carbon comprises approximately fifty atomic percent boron atoms.

20. The method of claim 13, wherein the quenched un-doped amorphous carbon shows ambient temperature ferromagnetism with a Curie temperature above 500 K.

* * * * *